United States Patent
Chen et al.

(10) Patent No.: US 9,361,993 B1
(45) Date of Patent: Jun. 7, 2016

(54) METHOD OF REDUCING HOT ELECTRON INJECTION TYPE OF READ DISTURB IN MEMORY

(71) Applicant: SanDisk Technologies Inc., Plano, TX (US)

(72) Inventors: Hong-Yan Chen, Sunnyvale, CA (US); Yingda Dong, San Jose, CA (US); Wei Zhao, Fremont, CA (US); Charles Kwong, Redwood City, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/601,531

(22) Filed: Jan. 21, 2015

(51) Int. Cl.
  *G11C 19/08* (2006.01)
  *G11C 16/26* (2006.01)
  *G11C 16/04* (2006.01)

(52) U.S. Cl.
  CPC ............ *G11C 16/26* (2013.01); *G11C 16/0483* (2013.01)

(58) Field of Classification Search
  CPC ....................................................... G11C 16/26
  USPC ........................................ 365/185.01–185.33
  See application file for complete search history.

(56) References Cited

U.S. PATENT DOCUMENTS

| | | | |
|---|---|---|---|
| 7,304,894 B2 | 12/2007 | Joo et al. | |
| 7,349,258 B2 | 3/2008 | Fong et al. | |
| 7,623,385 B2 | 11/2009 | Kim et al. | |
| 7,692,961 B2 | 4/2010 | Eltan et al. | |
| 8,670,285 B2 | 3/2014 | Dong et al. | |
| 8,867,271 B2 | 10/2014 | Li et al. | |
| 2008/0081419 A1* | 4/2008 | Ito ...................... | G11C 16/0483 438/266 |
| 2013/0201760 A1* | 8/2013 | Dong ................. | G11C 11/5642 365/185.17 |
| 2013/0250690 A1* | 9/2013 | Lai ..................... | G11C 11/5628 365/185.17 |

* cited by examiner

*Primary Examiner* — Richard Elms
*Assistant Examiner* — Sultana Begum
(74) *Attorney, Agent, or Firm* — Vierra Magen Marcus LLP

(57) ABSTRACT

Read disturb is reduced in a charge-trapping memory device such as a 3D memory device by optimizing the channel boosting voltage in an unselected NAND string. A pass voltage applied to the unselected word lines can cause a large gradient in the channel which leads to electron-hole formation and a hot electron injection (HEI) type of read disturb. When the selected word line is close to the source-side of the NAND string, HEI disturb occurs on the drain-side of the selected word line. To avoid this disturb, a spike is provided in the control gate voltage of a drain-side selected gate transistor to temporarily connect the channel to the bit line, lowering the voltage of the associated channel region. A similar approach is used for a drain-side selected word line. The spike may be omitted when the selected word line is mid-range.

21 Claims, 20 Drawing Sheets

Fig. 1C

Code in storage device (150)

boot code (151)

control code / set of instructions (160)

instructions to apply an increasing voltage to unselected memory cells in unselected levels of a memory device in connection with a sensing operation (161)

instructions to control a select gate of an unselected NAND string to, at different times during the applying of the increasing voltage, allow a driven voltage on a bit line to reach a channel of the unselected NAND string and prevent the driven voltage on the bit line from reaching the channel of the unselected NAND string (162)

instructions to sense a current in the selected NAND string via the bit line while the boosting level is set in the channel of the unselected NAND string (163)

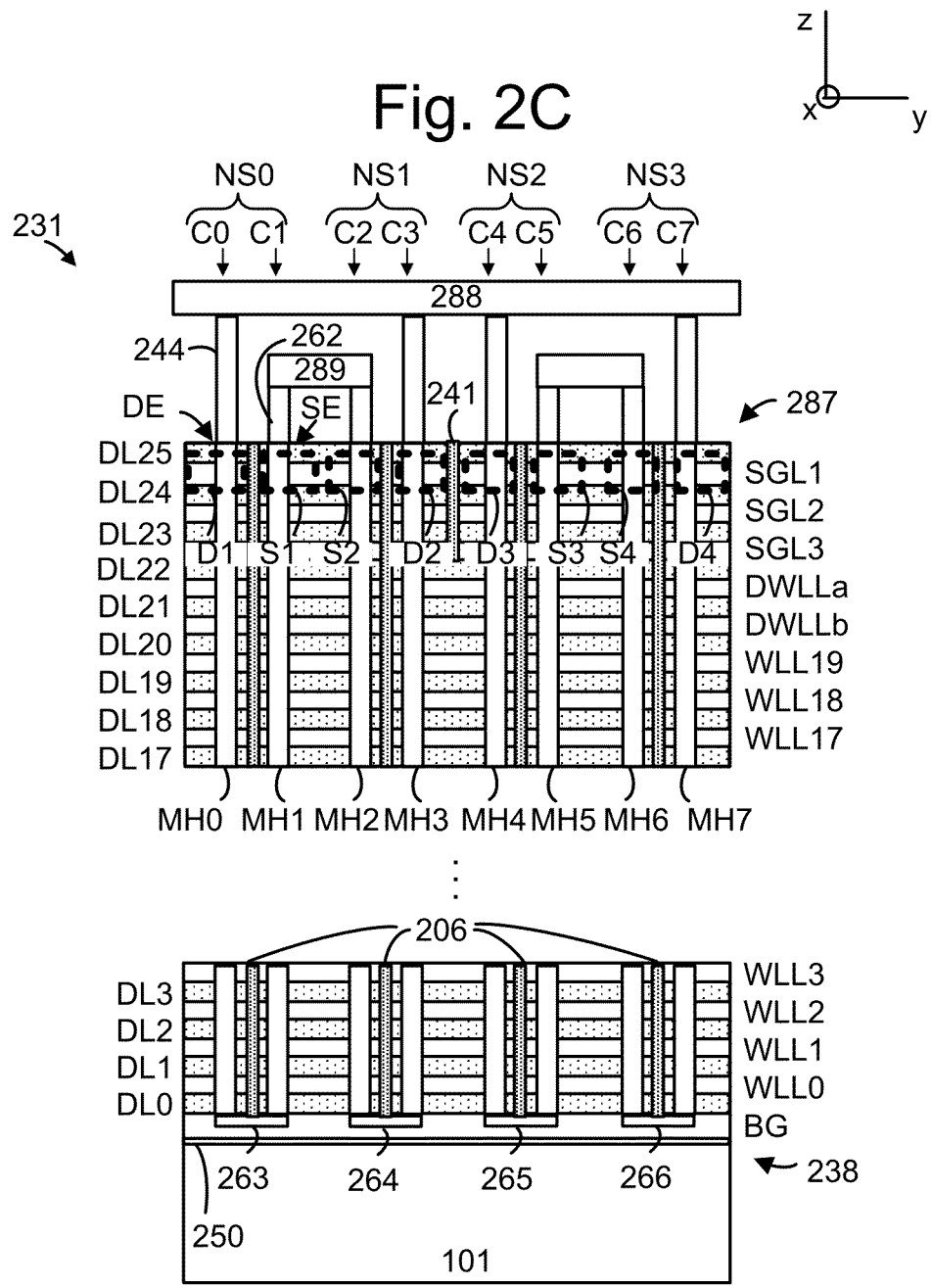

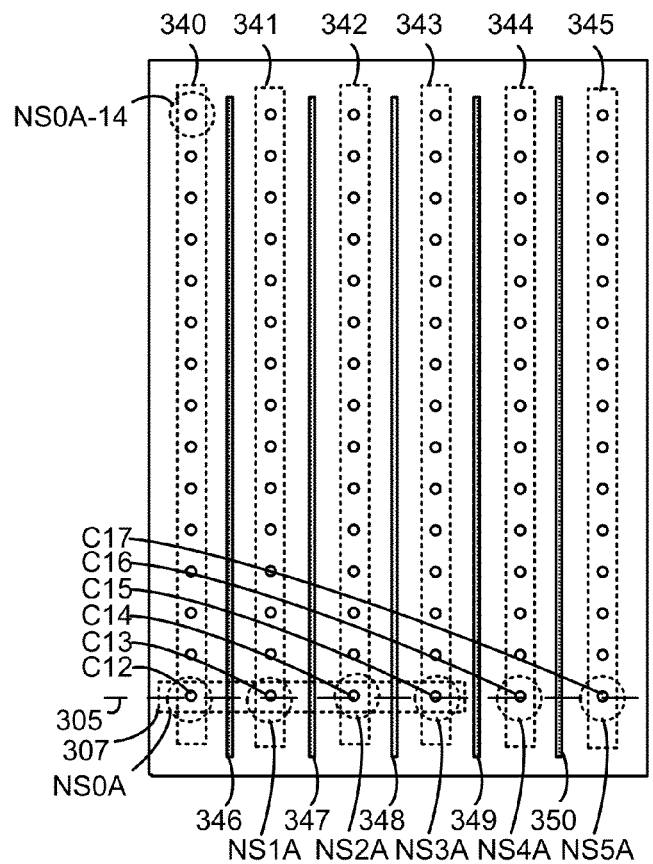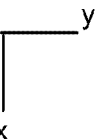
Fig. 3A
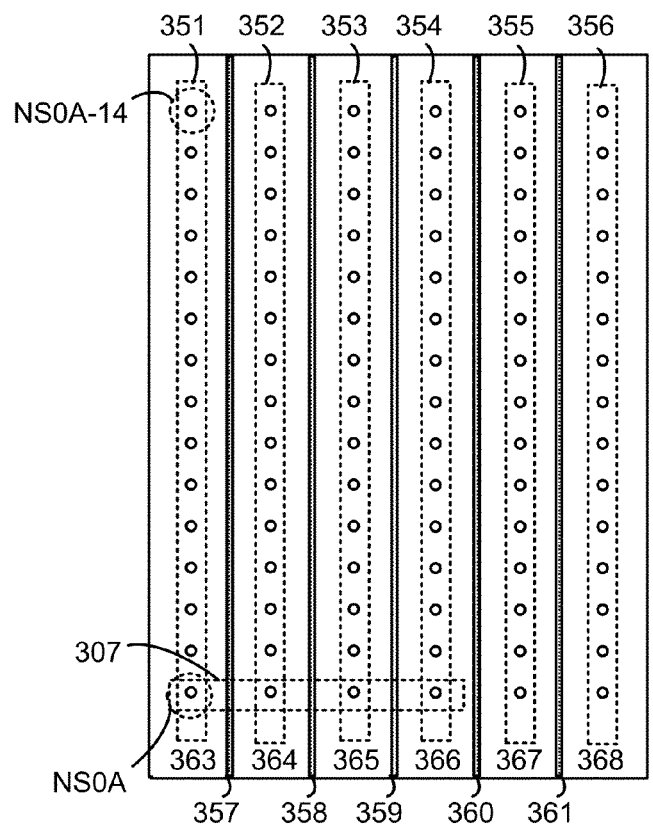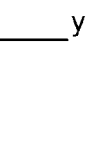
Fig. 3B

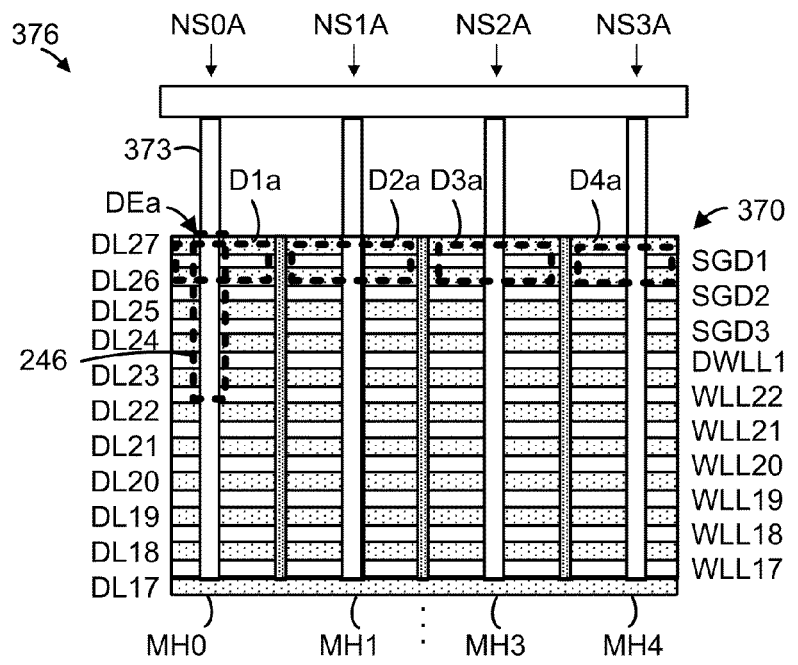
Fig. 3C1
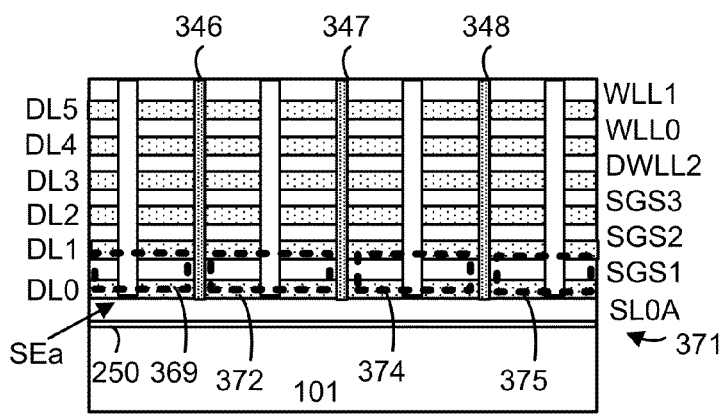
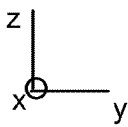
Fig. 3C2

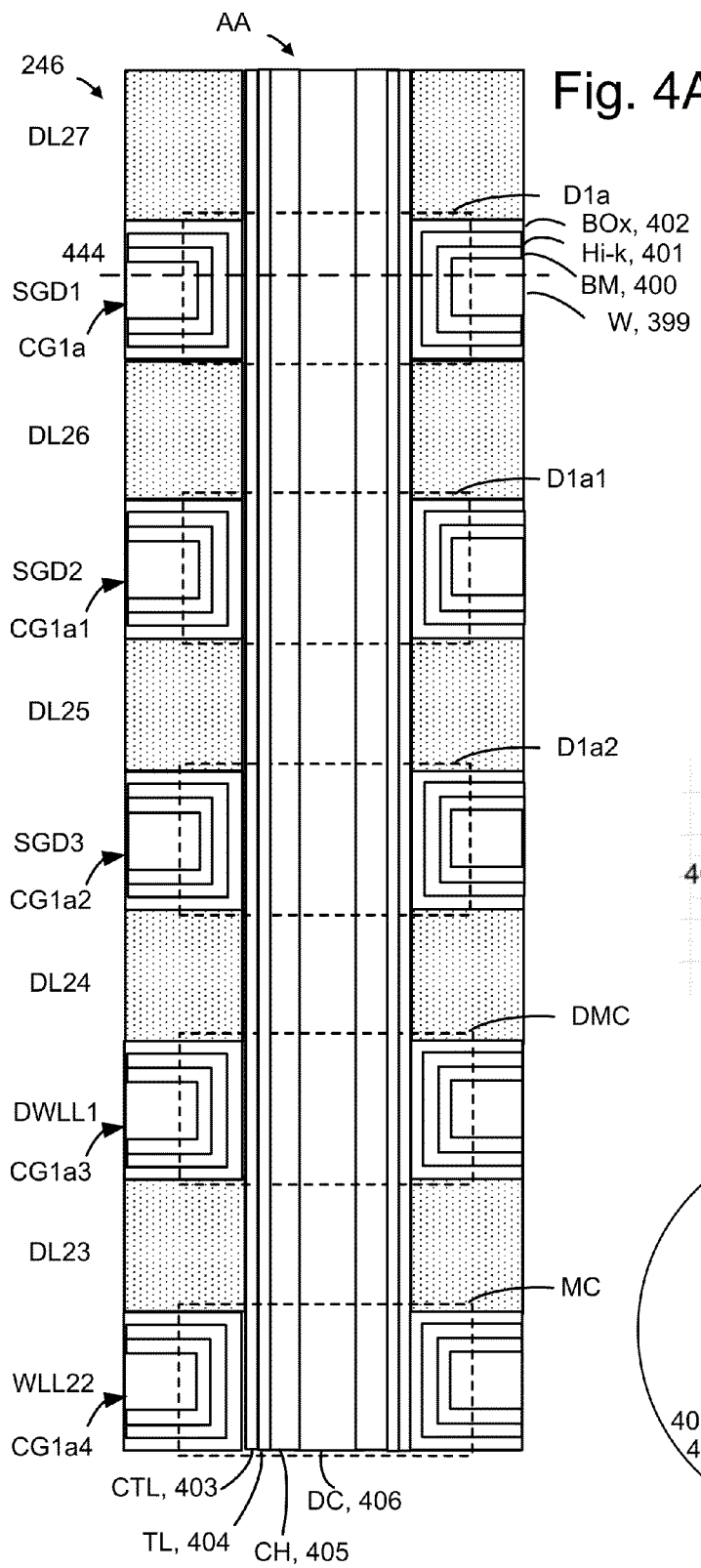
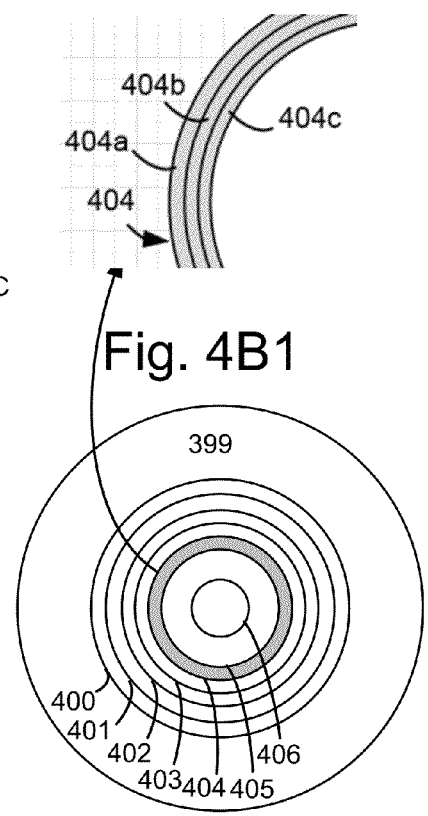
Fig. 4A
Fig. 4B1
Fig. 4B2

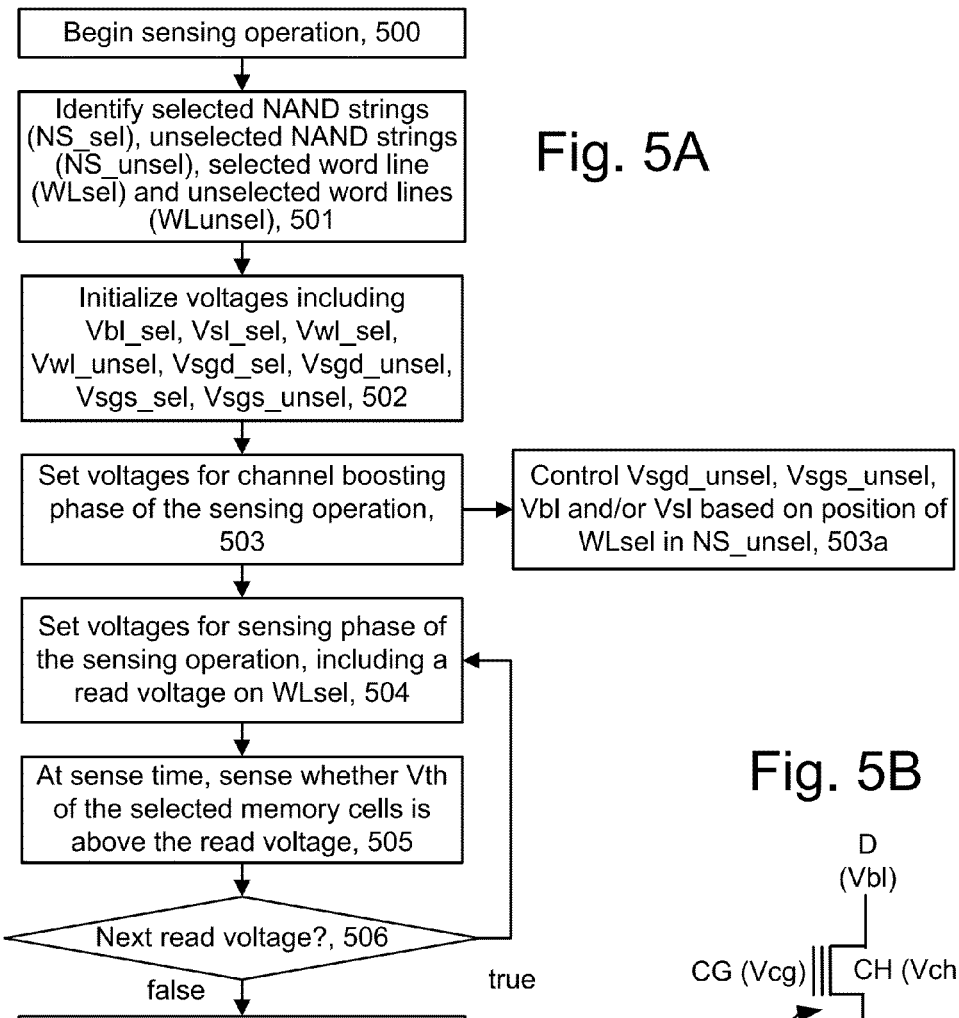
Fig. 5A
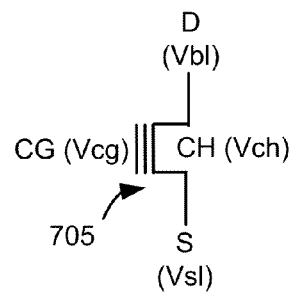
Fig. 5B
Fig. 6
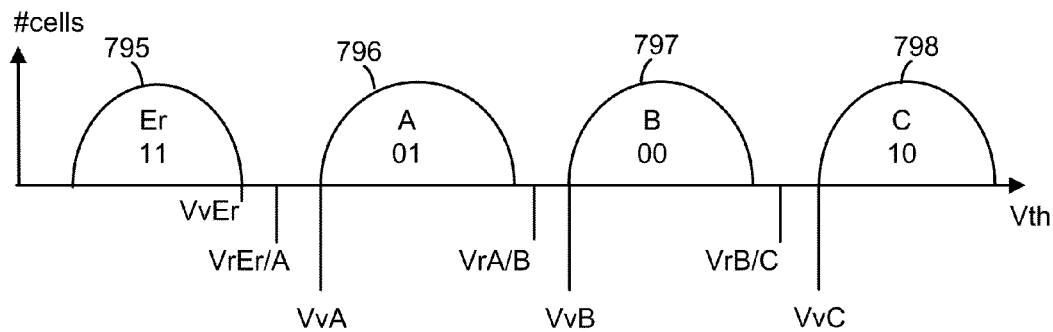

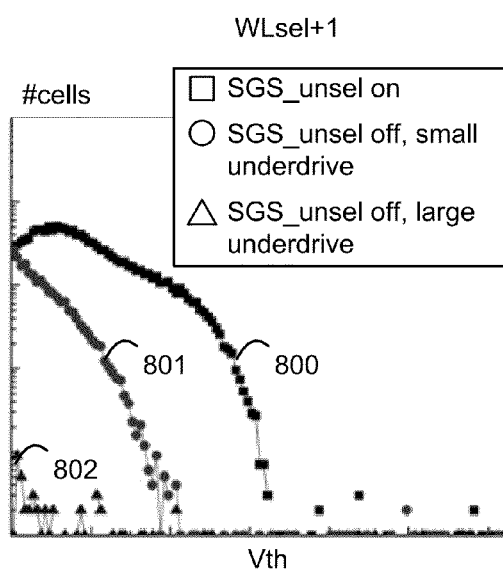
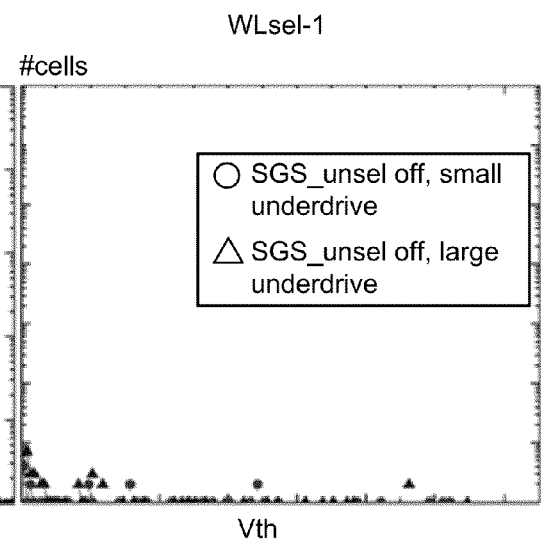
Fig. 8A — WLsel+1
Fig. 8B — WLsel-1
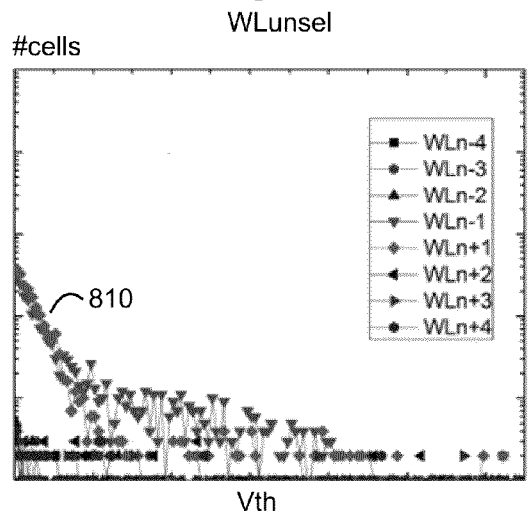
Fig. 10 — WLunsel Source-side WLsel – Vwl_sel spike on

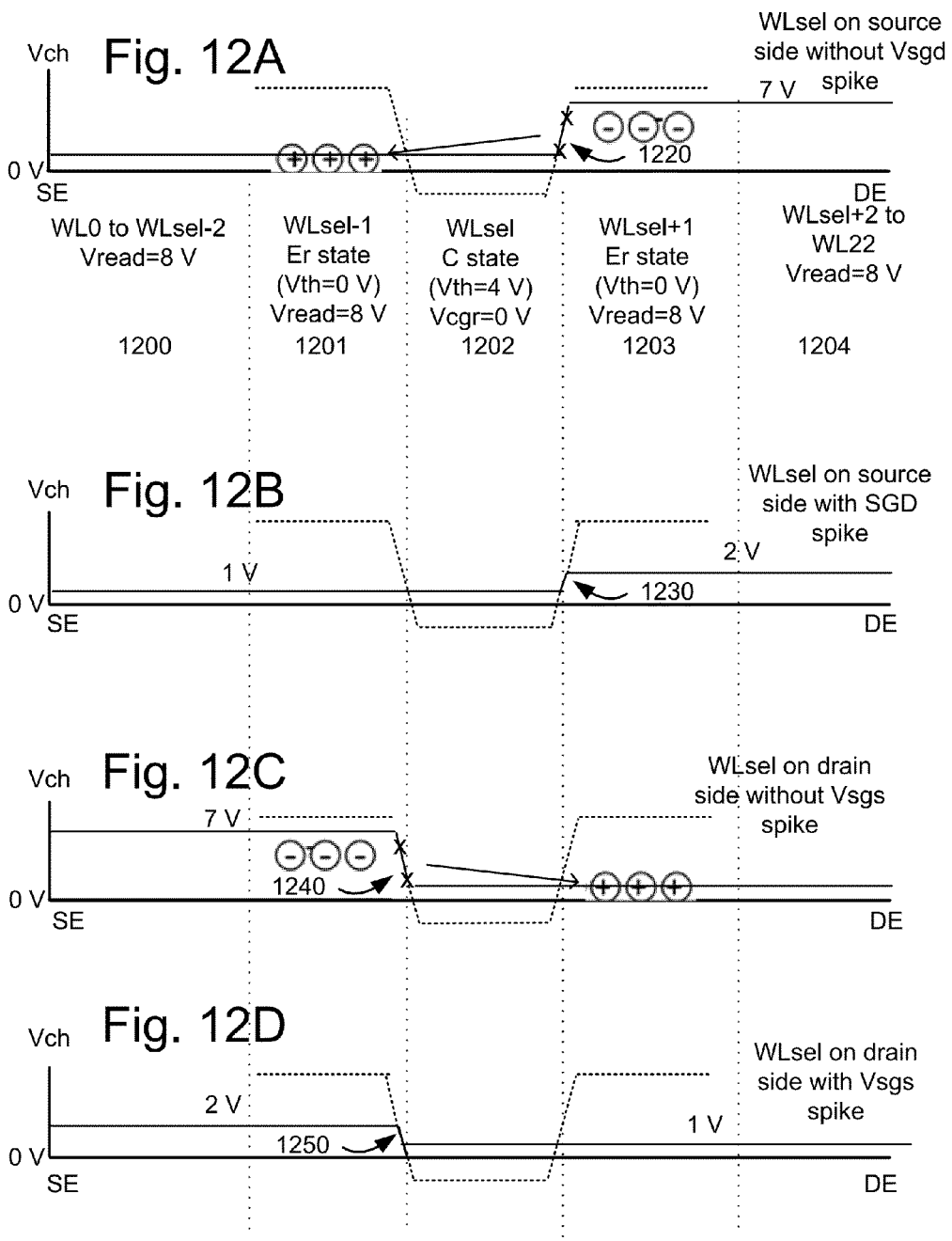

METHOD OF REDUCING HOT ELECTRON INJECTION TYPE OF READ DISTURB IN MEMORY

BACKGROUND

The present technology relates to operation of memory devices.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 1C depicts code which may be executed by a processor.

FIG. 2C depicts an embodiment of a stack 231 showing a cross-sectional view of the portion 209 of FIG. 2A, along line 220, where three select gate layers, SGL1, SGL2 and SGL3 are provided.

FIG. 3A depicts a top view of an example word line layer 304 of the block BLK0 of FIG. 1A, in a straight NAND string embodiment.

FIG. 3B depicts a top view of an example SGD layer 362, consistent with FIG. 3A.

FIG. 3C1 depicts an embodiment of a stack 376 showing a cross-sectional view of the portion 307 of FIG. 3A, along line 305, where three SGD layers, three SGS layers and dummy word line layers DWLL1 and DWLL2 are provided.

FIG. 3C2 depicts a variation in the width of a memory hole along its height.

FIG. 4A depicts a view of the region 246 of FIG. 3C1, showing SGD transistors D1a (consistent with FIG. 3C1), D1a1 and D1a2 above a dummy memory cell (DMC) and a data-storing memory cell (MC).

FIG. 4B1 depicts a cross-section view of the region 246 of FIG. 4A along line 444.

FIG. 4B2 depicts a close-up view of the tunneling layer 404 of FIG. 4B1, showing an oxide 404a, nitride 404b, oxide 404c configuration.

FIG. 5A depicts a process for performing a sensing operation on a selected word line, where a channel boosting voltage for an unselected NAND string is controlled based on a position of the selected word line (WLsel).

FIG. 5B depicts a circuit diagram of an example memory cell such as the memory cell 705 of FIG. 7.

FIG. 6 depicts a threshold voltage (Vth) distribution and example read voltages for a set of memory cells, consistent with the process of FIG. 5A.

FIG. 8A depicts a plot of a Vth distribution for memory cells of WLsel+1, including a plot 800 where the SGS transistor is conductive (on) and SGD is non-conductive (off), a plot 801 where the SGS and SGD transistors are non-conductive and the SGS transistor is underdriven by a smaller amount than the SGD transistor, and a plot 802 where the SGS and SGD transistors are non-conductive and the SGS transistor is underdriven by a same amount as the SGD transistor, where the amount of read stress is relatively small.

FIG. 8B depicts a plot of a Vth distribution similar to FIG. 8A except that it is for memory cells of WLsel−1.

FIG. 10 depicts a plot of a Vth distribution for memory cells of various unselected word lines near a selected word line, for a case where the SGS transistor and SGD transistor are non-conductive and are underdriven by a same amount, where the amount of read stress is relatively large.

FIG. 12A depicts a plot of Vch in the unselected NAND string of FIG. 9A, in a next moment in time, where WLsel is source-side and there is no spike in Vsgd_unsel.

FIG. 12B depicts a plot of Vch in the unselected NAND string of FIG. 9A, in a next moment in time, for a case where the SGS transistor and SGD transistor are non-conductive and are underdriven by a same amount, except that a spike is provided in Vsgd_unsel during the increase in Vpass, and where WLsel is source-side.

FIG. 12C depicts a plot of Vch in the unselected NAND string of FIG. 9A, in a next moment in time, where WLsel is drain-side.

FIG. 12D depicts a plot of Vch in the unselected NAND string of FIG. 9A, in a next moment in time, for a case where the SGS transistor and SGD transistor are non-conductive and are underdriven by a same amount, except that a spike is provided in Vsgs during the increase in Vpass, and where WLsel is drain-side.

DETAILED DESCRIPTION

Figure 1A:
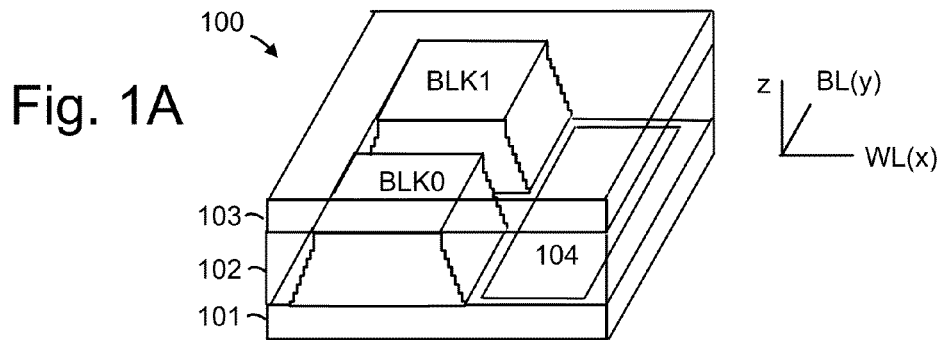
FIG. 1A is a perspective view of a 3D stacked non-volatile memory device.

Techniques are provided for performing a sensing operation in a memory device with reduced read disturb.

In an example, the memory device is a charge-trapping memory device. A charge-trapping memory device may use a charge-trapping material such as silicon nitride or other nitride, or in a multi-layer configuration such as an oxide-nitride-oxide (O—N—O) configuration. The charge-trapping material is separated from a channel layer by a tunneling layer. For example, a charge-trapping memory device may be a 3D memory device in which a stack of alternating conductive and dielectric layers are formed. Memory holes are etched in the stack and films are deposited in the holes such that memory cells or select gate transistors are formed where the conductive layers intersect with the memory holes. The films include a charge-trapping layer which extends vertically along an individual cell or an entire NAND string, a tunneling layer and a channel layer. Some of the conductive layers are used as control gates for memory cells and other conductive layers are used as control gates for select gate transistors, such as drain or source-side transistors in NAND strings. Another example of a charge-trapping memory device is a 2D memory device in which the charge-trapping layer extends horizontally along a NAND string.

In a 3D stacked non-volatile memory device, a read operation which is performed to read the state of selected memory cells can adversely impact the state of unselected memory cells in a process referred to a read disturb. For example, the memory device can be arranged in multiple blocks, where each block includes multiple sub-blocks, and a read operation is performed on a selected sub-block. The different sub-blocks can have the same word line layer, bit line and source line biases, but typically have separate select gate (SG) biases for source-side select gate (SGS) transistors and drain-side select gate (SGD) transistors. During the read in the selected sub-block, the SGS and SGD transistors of the unselected sub-blocks are typically turned off (made non-conductive) to cut off the conduction paths in unselected strings of the memory cells. A read-pass voltage (Vpass) of about 7-9 V is applied to the unselected word line layers, boosting a peak channel voltage of the unselected strings to about 8 V. This full measure of boosting is due to capacitive coupling from the unselected word line layers to the channel.

This channel boosting can help reduce the occurrence of normal read disturb for the unselected cells of the unselected strings. Normal read disturb results in an increase in the threshold voltage (Vth) of an unselected cell in a read operation. Normal read disturb is caused by weak Fowler-Nordheim (F-N) tunneling due to a large voltage difference between the control gate and a channel of a cell.

However, when a cell is being read with a relatively low voltage (Vwl_sel) on the selected word line layer, a large voltage gradient can be formed in the channel which results in electron/hole generation. This gradient can be formed between the selected word line and either of the adjacent word lines (e.g., WLsel+1 on the drain-side of WLsel and WLsel−1 on the source-side of WLsel). The generated electrons can be injected into the charge trap layers of the memory cells connected to the adjacent word lines and cause a hot electron injection (HEI) type of read disturb.

One way to suppress HEI read disturb is to discharge the boosting voltage inside the channel in the unselected NAND strings by grounding the channel, so that voltage gradient in the channel between the selected word line and the adjacent word lines is removed. However, this can result in an increase in the normal read disturb. Moreover, this approach does not account for the fact that the HEI read disturb is a function of the selected word line position and the amount of underdrive of the select gate transistors.

Techniques are provided herein in which the channel boosting voltage in unselected NAND strings is set to minimize read disturb including both normal read disturb and HEI read disturb. The techniques account for the position of the selected word line. In one approach, WLsel is at a source-side of the NAND strings. In this case, the SGD transistor of an unselected NAND string receives a voltage spike which provides the SGD transistor in a temporarily conductive state, during the ramping up of Vpass on the unselected word lines. This reduces the channel boosting voltage (Vch), in particular, on the drain-side of WLsel, since the channel is not capacitively coupled higher by Vpass while the SGD transistor is conductive. That is, the channel is not capacitively coupled higher because the channel is not floating during the spike. This approach reduces the channel gradient between WLsel and WLsel+1, so that HEI disturb is reduced for the memory cells in the unselected NAND strings which are connected to WLsel+1, where these memory cells are most susceptible to HEI disturb. Moreover, Vch on the drain-side of WLsel can be provided at a positive, non-zero level to minimize normal read disturb. Since the majority of the channel is on the drain-side of the selected word line, this portion of the channel will have an optimum Vch which minimizes read disturb.

In some cases, Vwl_sel is an edge word line at the source-side of the NAND strings. In other cases, Vwl_sel is a non-edge word line on the source-side of the NAND strings so that a remaining portion of the channel is on the source-side of WLsel. This portion of the channel may be cutoff from the portion of the channel on the drain-side of WLsel if Vwl_sel is sufficiently low compared to a Vth level of the associated memory cell. The source-side portion of the channel will tend to be capacitively coupled up to a relatively low level so that a spike on SGS is not used to reduce the associated Vch.

Alternatively, a spike in Vwl_sel can be used at the same time as the spike in the SGD transistor to allow the portion of the channel on the source-side of WLsel to communicate with the portion of the channel on the drain-side of WLsel. In this case, Vch on the source-side of WLsel will tend to be similar to Vch on the drain-side of WLsel.

Similarly, if WLsel is at a drain-side of the NAND strings, the SGS transistor of an unselected NAND string receives a voltage spike which provides the SGS transistor in a temporarily conductive state, during the ramping up of Vpass. This reduces the Vch on the source-side of WLsel. As a result, this approach reduces the channel gradient between WLsel and WLsel−1, so that HEI disturb is reduced for the memory cells in the unselected NAND strings which are connected to WLsel−1, where these memory cells are most susceptible to HEI disturb. Moreover, Vch on the source-side of WLsel can be provided at a positive, non-zero level to minimize normal read disturb.

If WLsel is in the middle of the NAND strings, the Vch may be balanced on either side of WLsel such that a significant channel gradient is not created between WLsel and WLsel−1, or between WLsel and WLsel+1, so that HEI disturb is avoided.

Additionally, the spike can be optimized according to the position of WLsel. For example, the spike on the SGD transistor can be longer in duration when WLsel is further from the SGD transistor, and the spike on the SGS transistor can be longer in duration when WLsel is further from the SGS transistor. Moreover, the bit line voltage (Vbl) spike can be lower in magnitude when WLsel is further from the SGD transistor, and higher in magnitude when WLsel is closer to the SGD transistor. In other words, a stronger countermeasure is taken to reduce HEI read disturb when the likelihood of the disturb is greater.

The following discussion provides details of the construction of example memory devices and of related techniques which address the above and other issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
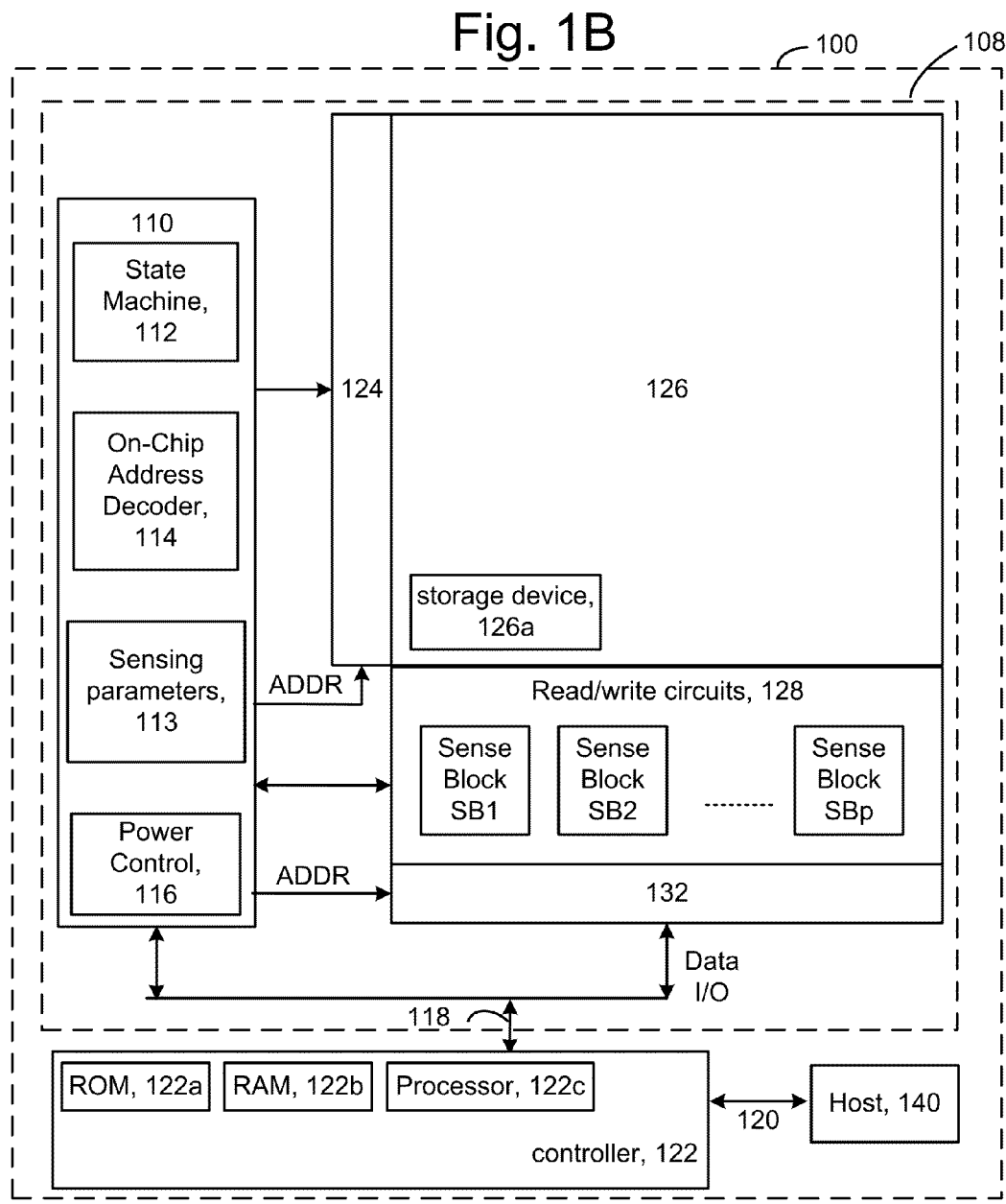
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The memory die 108 includes a memory structure 126 of memory cells, such as an array of memory cells, control circuitry 110, and read/write circuits 128. In a 3D configuration, the memory structure can include the blocks BLK0 and BLK1 of FIG. 1A. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for a sensing operation as described herein.

The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp (including the processor 192 and managing circuit MC0 in FIG. 1D), read/write circuits 128, and controller 122, and so forth. The sense block SB1 is discussed further in connection with FIG. 1D.

The off-chip controller 122 may comprise a processor 122$c$ and storage devices (memory) such as ROM 122$a$ and RAM 122$b$. The storage devices comprises code such as a set of instructions, and the processor is operable to execute the set of instructions to provide the functionality described herein. Alternatively or additionally, the processor can access code from a storage device 126$a$ of the memory structure, such as a reserved area of memory cells in one or more word lines.

For example, FIG. 1C depicts code which may be executed by the processor 122$c$. The code 150 is used by the controller to access the memory structure such as for programming, read and erase operations. The code can include boot code 151 and control code (set of instructions) 160. The boot code is software that initializes the controller during a booting or startup process and enables the controller to access the memory structure. The code can be used by the controller to control one or more memory structures. Upon being powered up, the processor 122$c$ fetches the boot code from the ROM 122$a$ or storage device 126$a$ for execution, and the boot code initializes the system components and loads the control code into the RAM 122$b$. Once the control code is loaded into the RAM, it is executed by the processor. The control code includes drivers to perform basic tasks such as controlling and allocating memory, prioritizing the processing of instructions, and controlling input and output ports.

The control code further includes instructions to apply an increasing voltage to unselected memory cells in unselected word lines of a memory device in connection with a sensing operation (161), instructions to control a select gate of an unselected NAND string to, at different times during the applying of the increasing voltage, allow a driven voltage on a bit line to reach a channel of the unselected NAND string and prevent the driven voltage on the bit line from reaching the channel of the unselected NAND string (162), and instructions to sense a current in the selected NAND string via the bit line while the boosting voltage is set in the channel of the unselected NAND string (163). Generally, the control code can include instructions to perform the functions described herein including the steps of the process of FIG. 5A.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

Figure 1D:
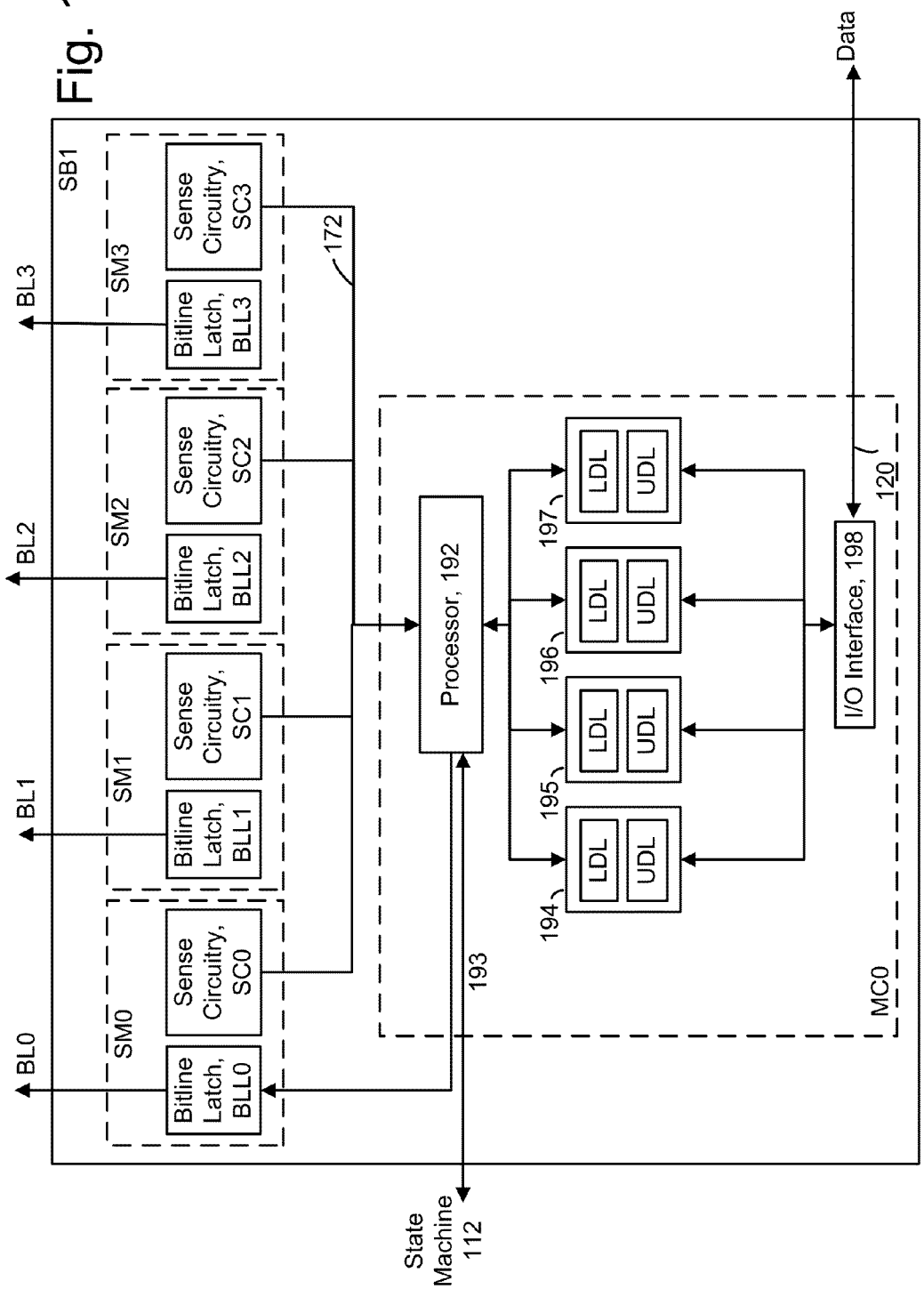
FIG. 1D is a block diagram depicting one embodiment of the sense block SB1 of FIG. 1B.

FIG. 1D is a block diagram depicting one embodiment of the sense block SB1 of FIG. 1B. The sense block is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming voltage, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a processor 192, four example sets of data latches 194, 195, 196 and 197 and an I/O interface 198 coupled between the sets of data latches and the data bus 120. One set of data latches can be provide for each sense module, and may include data latches identified by LDL and UDL. LDL stores a bit for a lower page (LP) of write data, and UDL stores a bit for an upper page (UP) of write data, in a memory which stores two bits of data in each memory cell.

Additional data latches could be used as well. For example, in a three-bit per memory cell implementation, one extra data latch may be used to store a middle page (MP) of data. A four-bit per memory cell implementation can use lower-middle and upper-middle data latches. The techniques provided herein are meant to encompass such variations. In a further option, another latch is used to identify whether a memory cell is in a slow programming mode when its Vth is within a specified margin of the verify voltage of its target data state.

The processor 192 performs computations during reading and programming. For reading, the processor determines the data state stored in the sensed memory cell and stores the data in the set of data latches. For full programming and refresh programming, the processor reads the latches to determine the data state which is to be written to a memory cell.

During reading, the operation of the system is under the control of the state machine 112 which controls the supply of different control gate voltages to the addressed memory cell. As it steps through the various predefined control gate voltages (e.g., VrEr/A, VrA/B and VrB/C in FIG. 6) corresponding to the various memory states supported by the memory (e.g., states A, B and C), the sense module may trip at one of these voltages and a corresponding output will be provided from the sense module to the processor 192 via the data bus 172. At that point, processor 192 determines the memory state by consideration of the tripping event(s) of the sense module and the information about the applied control gate voltage from the state machine via input lines 193. It then computes a binary encoding for the memory state and stores the resultant data bits into the sets of data latches 194-197. In another embodiment of the managing circuit MC0, the bit line latch serves both as a latch for latching the output of the sense module and also as a bit line latch as described above.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense modules, the state machine needs to read the wired-OR line four times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP data latches. The programming operation, under the control of the state machine, comprises a series of programming voltage pulses applied to the control gates of the addressed memory cells. Each programming voltage is followed by a read back (verify) to determine if the memory cell has been programmed to the desired memory state. In some cases, processor monitors the read back memory state relative to the desired memory state. When the two states agree, the processor sets the bit line latch to cause the bit line to be pulled to a state designating program inhibit (e.g., 2-3 V). This inhibits the memory cell coupled to the bit line from further programming even if programming voltages appear on its control gate. In other embodiments, the processor initially loads the bit line latch and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figures 2A, 2B:
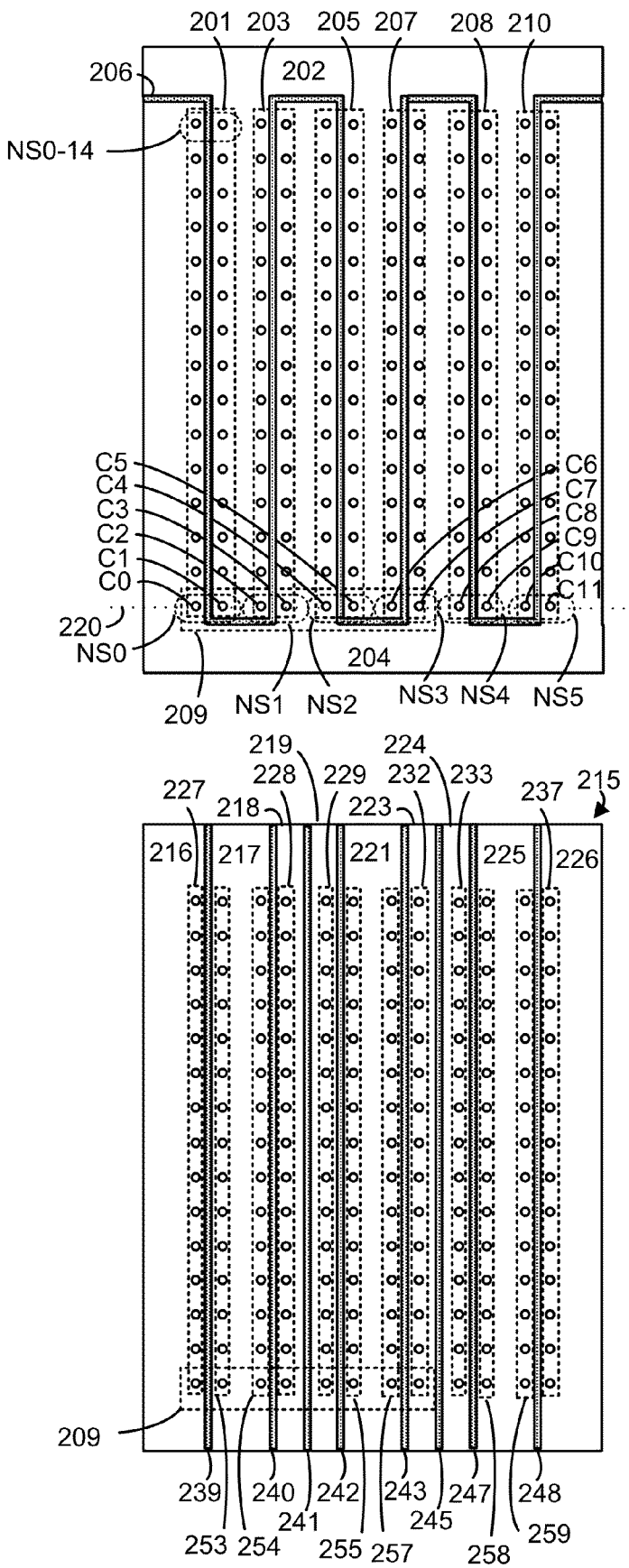
FIG. 2A depicts a top view of example word line layers 202 and 204 in a U-shaped NAND embodiment, as an example implementation of BLK0 in FIG. 1A.
FIG. 2B depicts a top view of example select gate layer portions, consistent with FIG. 2A.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

The view is of a representative layer among the multiple WLLs in a stack. Referring also to FIG. 2C, the stack includes alternating dielectric and conductive layers. The dielectric layers include DL0 to DL25 and may be made of $SiO_2$, for instance. The conductive layers include a back gate layer (BGL), data-storing word line layers WLL0 to WLL19, dummy (non-data-storing) word line layers DWLLa and DWLLb, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes vertically-extending memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain-side columns of respective NAND strings. Columns C1, C2, C5, C6, C9 and C10 represent the source-side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2A. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings.

Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32 k memory columns in the x direction, for a total of 384,000 memory columns in a block. With U-shaped NAND strings, 192 k NAND strings are provided in this example. With straight NAND strings, 384,000 NAND strings are provided in this example. Assuming there are twenty-four memory cells per column, there are 384,000× 24=9,216,000 memory cells in the set.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD lines 216, 218, 219, 223, 224 and 226, respectively. Regions 253 and 254, 255 and 257, and 258 and 259 represent SGS transistors in SGS lines 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220, where three select gate layers, SGL1, SGL2 and SGL3 are provided. In this case, the slit extends down to DL22, so that three separate layers of select gate transistors are formed in each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain-side of C0 and NS0 to a bit line 288. A via 262 connects a source-side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors in SGL1.

Figure 2D:
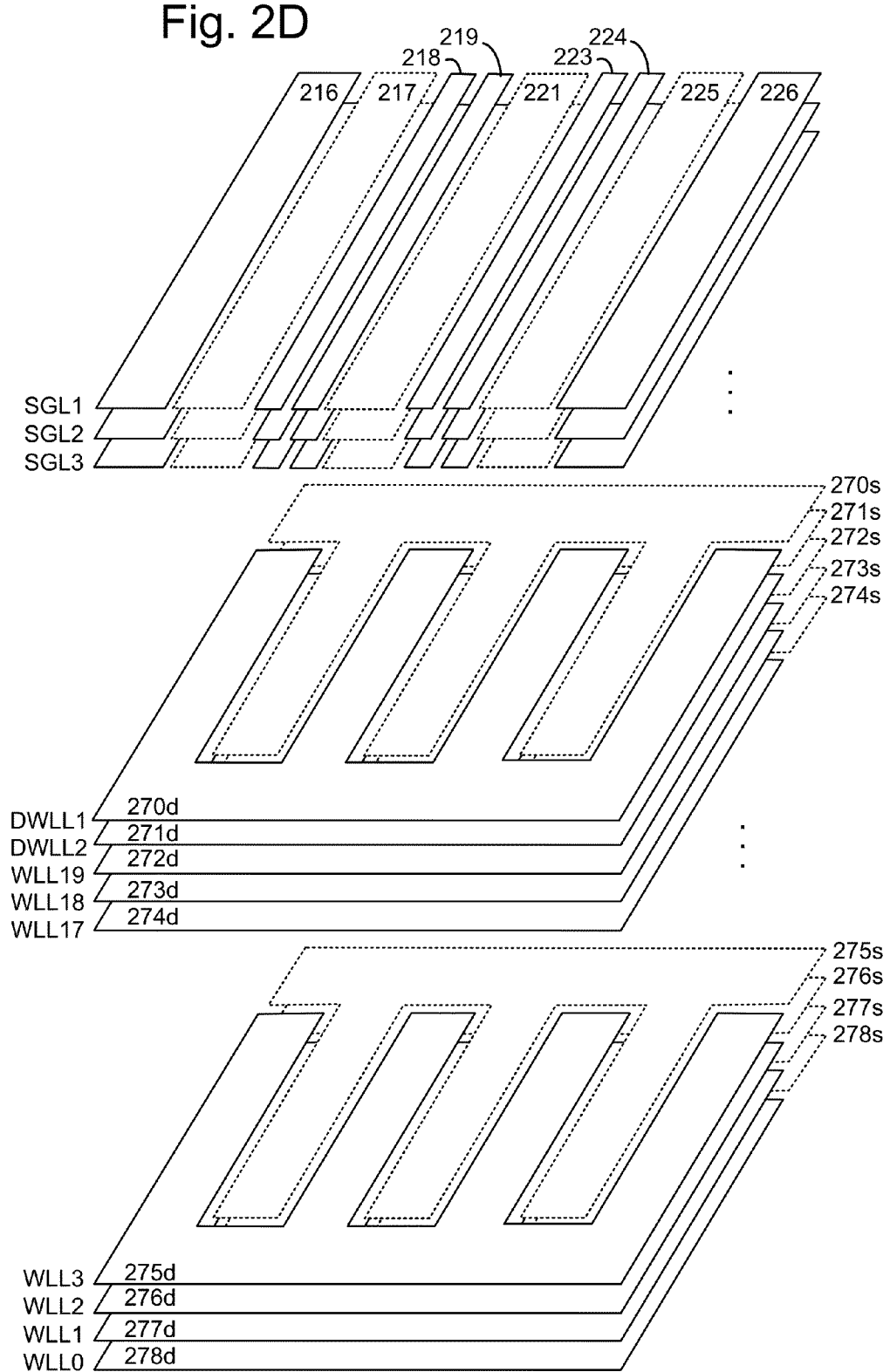
FIG. 2D depicts an alternative view of the select gate layers and word line layers of the stack 231 of FIG. 2C.

FIG. 2D depicts an alternative view of the select gate layers and word line layers of the stack 231 of FIG. 2C. The SGL layers SGL1, SGL2 and SGL3 each includes parallel rows of select gate lines associated with the drain-side (shown by solid lines) or source-side (shown by dotted lines) of a set of NAND strings. For example, SGL1 includes drain-side select gate lines 216, 218, 219, 223, 224 and 226 and source-side select gate lines 217, 221 and 225, consistent with FIG. 2B. Each select gate line can be independently controlled, in one approach.

Below, the SGL layers are the word line layers. Each word line layer includes a drain-side word line connected to memory cells on a drain-side of a NAND string (the half of a NAND string between the back gate and the drain end) and a source-side word line connected to memory cells on a source-side of a NAND string (the half of a NAND string between the back gate and the source end). For example, DWLL1, DWLL2, WLL19, WLL18 and WLL17 include drain-side word lines 270*d*, 271*d*, 272*d*, 273*d* and 274*d*, respectively, and source-side word lines 270*s*, 271*s*, 272*s*, 273*s* and 274*s*, respectively.

WLL3, WLL2, WLL1 and WLL0 include drain-side word lines 275*d*, 276*d*, 277*d* and 278*d*, respectively, and source-side word lines 275*s*, 276*s*, 277*s* and 278*s*, respectively. Each word line can be controlled independently, in one approach.

In an example programming operation, the source-side word line 272*s* is a first programmed word line and a drain-side word line 272*d* is a final programmed word line in a block.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C1.

Regions 340, 341, 342, 343, 344 and 345 represent the memory cells (as circles) of respective sets of NAND strings. For example, region 340 represents memory cells in NAND strings NS0A, . . . , NS0A-14. Additional NAND strings include NS1A, NS2A, NS3A, NS4A and NS5A.

Alternatively, the layer 304 represents an SGS layer, in which case each circle represents an SGS transistor.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C1 depicts an embodiment of a stack 376 showing a cross-sectional view of the portion 307 of FIG. 3A, along line 305, where three SGD layers, three SGS layers and dummy word line layers DWLL1 and DWLL2 are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors 369, 372, 374 and 375 are formed in the SGS1 layer.

A region 246 of the stack is shown in greater detail in FIG. 4A. Regions D1a, D2a, D3a and D4a represent SGD transistors.

FIG. 3C2 depicts a variation in the width of a memory hole along its height. Due to the etching process used to create the memory holes, the cross-sectional width, e.g., diameter, of the memory hole can vary along its height. This is due to the very high aspect ratio. For example, a depth-to-diameter ratio of about 25-30 is common. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the width of the vertical pillar which is formed in the memory hole, the programming and erase speed of the memory cells can vary based on their position along the memory hole. With a smaller diameter memory hole, the electric field across the tunneling layer is stronger, so that the programming and erase speed is higher.

In this case, the memory cells are arranged along vertically-extending memory holes (MH0-MH7) in the memory device, and a width of the vertically-extending memory holes varies along a height of the memory device.

Figure 3D:
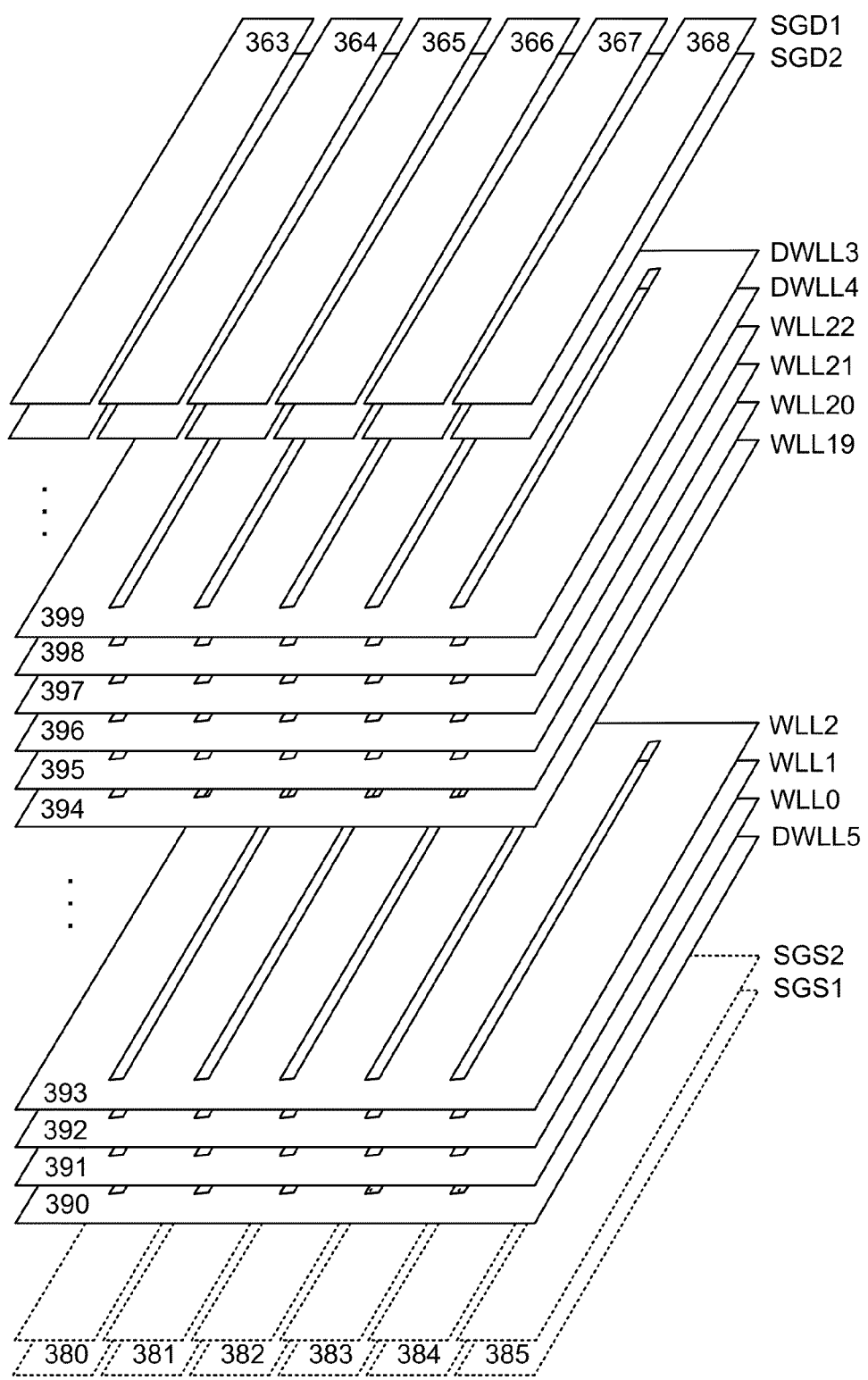
FIG. 3D depicts an alternative view of the select gate layers and word line layers of the stack 376 of FIG. 3C.

FIG. 3D depicts an alternative view of the select gate layers and word line layers of the stack 376 of FIG. 3C. The SGD layers SGD1 and SGD2 each includes parallel rows of select gate lines associated with the drain-side of a set of NAND strings. For example, SGD1 includes drain-side select gate lines 363, 364, 365, 366, 367 and 368, consistent with FIG. 3B. Each select gate line can be independently controlled, in one approach.

Below the SGD layers are the word line layers. Each word line layer represents a word line, in one approach, and is connected to a set of memory cells at a given height in the stack. For example, DWLL3, DWLL4, WLL22, WLL21, WLL20 and WLL19 represent word lines 399, 398, 397, 396, 395 and 394, respectively. WLL2, WLL1, WLL0 and DWLL5 represent word lines 393, 392, 391 and 390, respectively. Each word line can be controlled independently, in one approach.

Below the word line layers are the SGS layers. The SGS layers SGS1 and SGS2 each includes parallel rows of select gate lines associated with the source-side of a set of NAND strings. For example, SGS1 includes source-side select gate lines 380, 381, 382, 383, 384 and 385. Each select gate line can be independently controlled, in one approach.

In an example programming operation, the source-side word line 391 is a first programmed word line and a drain-side word line 397 is a final programmed word line in a block.

FIG. 4A depicts a view of the region 246 of FIG. 3C1, showing SGD transistors D1a, D1a1 and D1a2 above a dummy memory cell (DMC) and a data-storing memory cell (MC). A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 403 such as SiN or other nitride, a tunneling layer (TL) 404, a polysilicon body or channel (CH) 405, and a dielectric core (DC) 406. A word line layer includes a block oxide (BOx) 402, a block high-k material 401, a barrier metal 400, and a conductive metal such as W 399 as a control gate. For example, control gates CG1a, CG1a1, CG1a2, CG1a3 and CG1a4 are provided for the SGD transistors D1a, D1a1 and D1a2, the dummy memory cell DMC and the memory cell MC, respectively. In another approach, all of these layers except the metal are provided in the column. Additional memory cells are similarly formed throughout the columns. The layers in the memory hole form a columnar active area (AA) of the NAND string.

The use of one or more dummy memory cells between the select gate transistors and the data-storing memory cells is useful since program disturb can be greater for memory cells adjacent to, or close to, the select gate transistors. These edge cells have a lower amount of channel boosting due to constraints on the voltages of the select gate transistors of an inhibited NAND string. In particular, to provide the select gate transistors in a non-conductive state, a relatively low voltage is applied to their control gates, resulting in a relatively low amount of channel boosting in a region of the channel next to these select gate transistors. A region of the channel next to an edge cell will therefore also have a relatively low amount of channel boosting. In contrast, the memory cells next to a non-edge cell can receive a relatively high pass voltage since these cells are provided in a conductive state, resulting in a relatively higher amount of channel boosting.

When a memory cell is programmed, electrons are stored in a portion of the CTL which is associated with the memory cell. These electrons are drawn into the CTL from the channel, and through the tunneling layer (TL). The Vth of a memory cell is increased in proportion to the amount of stored charge. During an erase operation, the electrons return to the channel.

Each of the memory holes can be filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes.

FIG. 4B1 depicts a cross-section view of the region 246 of FIG. 4A along line 444. Each layer is ring-shaped in one possible approach, except the core filler, which is a cylinder.

FIG. 4B2 depicts a close-up view of the tunneling layer 404 of FIG. 4B1, showing an oxide 404a, nitride 404b, oxide 404c configuration.

FIG. 5A depicts a process for performing a sensing operation on a selected word line, where a channel boosting voltage for an unselected NAND string is controlled based on a position of the selected word line. A sensing operation begins at step 500. A sensing operation can include a read operation which determines the data state of a set of memory cells based on a read voltage which defines a lower Vth of the data state and a read voltage which defines an upper Vth of the data state, for example. This type of read operation occurs after a programming operation is completed. A sensing operation could also include a verify test which determines whether the Vth of a memory cell exceeds the verify voltage of a respective target data state during a programming operation. See FIG. 6 for example sensing voltages.

Step 501 includes identifying one or more selected NAND strings (e.g., NS_sel in FIG. 7), one or more unselected NAND strings (e.g., NS_unsel in FIG. 7), a selected word line (WLsel) and unselected word lines (WLunsel). For example, the selected NAND strings may be in a selected sub-block of memory cells (e.g., NS0A to NS0A-14 associated with region 340 in FIG. 3A), and the unselected NAND strings may be in one or more unselected sub-blocks of memory cells (e.g., NAND strings associated with regions 341-345 in FIG. 3A). Each sub-block of NAND strings may have a common control line connected to their SGD transistors, for instance. The selected word line may be a selected word line layer in a stacked 3D memory device, and the unselected word lines may include the remaining word line layers.

Step 502 includes initializing the voltages including Vbl_sel, Vsl_sel, Vwl_sel, Vwl_unsel, Vsgd_sel, Vsgd_unsel, Vsgs_sel and Vsgs_unsel. Step 503 includes setting voltages for a channel boosting phase of the sensing operation. In this phase, the voltage in the channels of the unselected NAND strings is increased due to capacitive coupling from the increasing Vpass. The amount of capacitive coupling is proportional to the increase in Vpass while the channel is floated. Step 503 can be implemented using step 503a, which controls Vsgd_unsel, Vsgs_unsel, Vbl and/or Vsl based on a position of WLsel in NS_unsel.

Step 504 sets voltages for a sensing phase of the sensing operation, including a read voltage on WLsel. In this phase, the channel of the unselected NAND string may remain at, or close to, the boosted level which was set in the channel boosting phase. Step 505, at a sense time, senses whether the Vth of the selected memory cells is above the read voltage. A decision step 506 determines whether there is a next read voltage to apply to WLsel. If decision step 506 is true, then step 504 is repeated with the next read voltage. If decision step 506 is false, the sensing operation ends at step 507.

Figure 7:
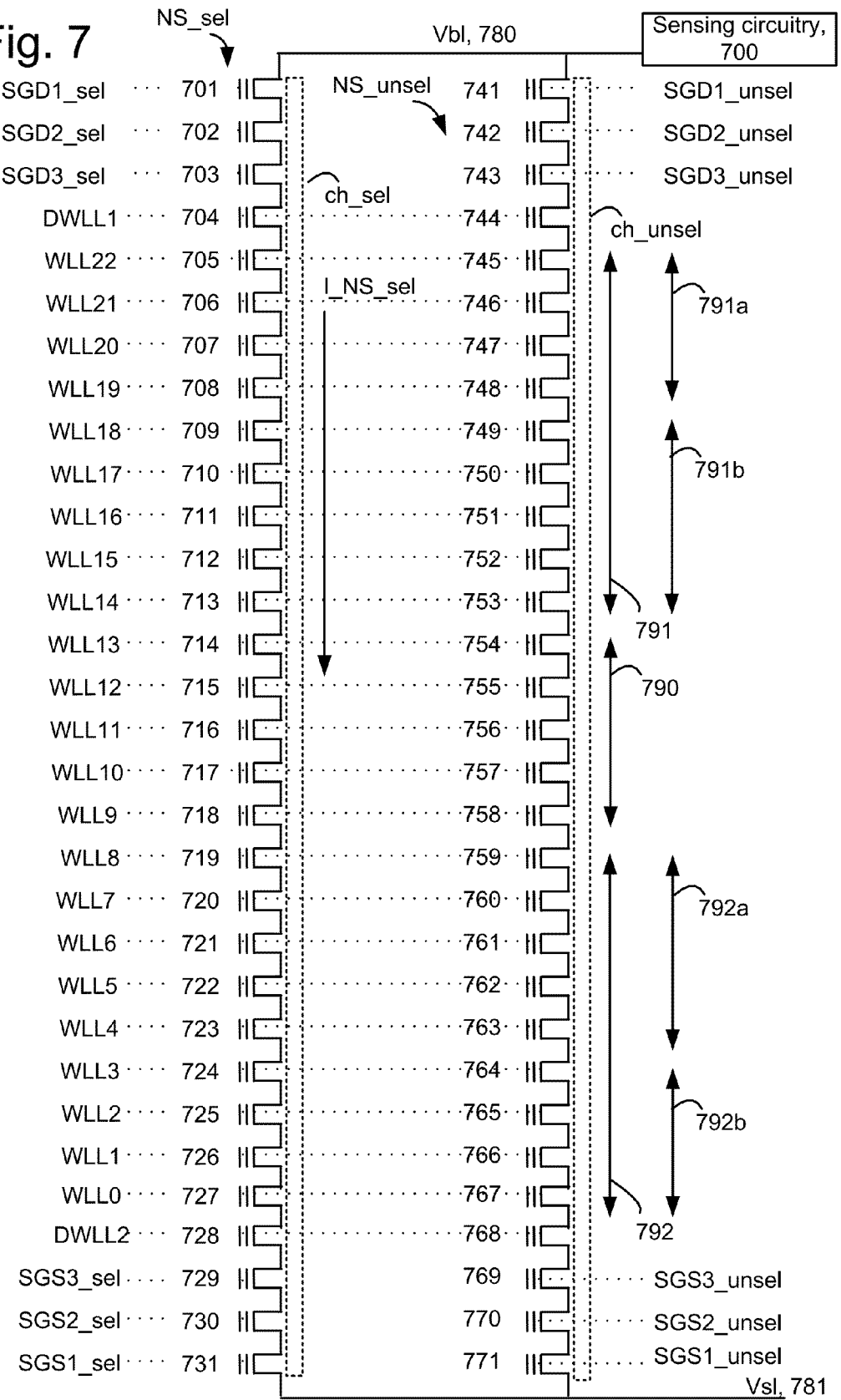
FIG. 7 depicts a circuit diagram of a selected NAND string (NS_sel) and an unselected NAND string (NS_unsel), consistent with the sensing process of FIG. 5A and with the memory devices of FIGS. 2C and 3C1.

FIG. 5B depicts a circuit diagram of an example memory cell such as the memory cell 705 of FIG. 7. The memory cell includes a number of terminals including a drain (D) terminal which may have a voltage Vbl, a source (S) terminal which may have a voltage Vsl, a control gate (CG) terminal which may have a voltage Vcg and a channel (CH) terminal which may have a voltage Vch.

FIG. 6 depicts a threshold voltage (Vth) distribution and example read voltages for a set of memory cells, consistent with the process of FIG. 5A. The horizontal axis represents Vth and the vertical axis represents a number of memory cells on a logarithmic scale. The Vth distributions are shown in a simplified form for clarity.

In one approach, a one programming pass operation, also referred to as full sequence programming, involves (only) one sequence of multiple program-verify operations (or program loops) which are performed starting from an initial Vpgm level and proceeding to a final Vpgm level until the threshold voltages of a set of selected memory cells reach one or more respective verify voltages of respective target data states. All memory cells may initially be in an erased state at the beginning of the programming pass.

Example Vth distributions for the memory cell array are provided for a case where each memory cell stores two bits of data in one of four possible Vth ranges. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A bit combination is stored in a set of latches such as in FIG. 1D. For example, the LP bit can be stored in LDL and the UP bit can be stored in UDL. In another example, each memory cell stores three bits of data in one of eight possible Vth ranges.

A first Vth distribution 795 is provided for erased (Er) state memory cells. Vth distributions 796, 797 and 798 represent target data states A, B and C, respectively, which are reached by memory cells when their Vth exceeds the verify voltage VvA, VvB or VvC, respectively. VvEr is an erase verify voltage.

After the programming pass is completed, the data can be read from the memory cells using read reference voltages VrEr/A, VrA/B and VrB/C which are between the Vth distributions. By testing whether the Vth of a given memory cell is above or below one or more of the read reference voltages, the system can determine the data state which is represented by a memory cell.

FIG. 7 depicts a circuit diagram of a selected NAND string (NS_sel) and an unselected NAND string (NS_unsel), consistent with the sensing process of FIG. 5A and with the memory devices of FIGS. 2C and 3C1. The word lines for data-storing memory cells are WLL0-WLL22. WLL0-WLL22 are connected to data-storing memory cells 727-705, respectively, in NS_sel and to data-storing memory cells 767-745, respectively, in NS_unsel. Dummy word lines DWLL1 and DWLL2 are connected to dummy memory cells 704 and 728, respectively, in NS_sel and to dummy memory cells 744 and 768, respectively, in NS_unsel. The word lines are connected to both the selected and unselected NAND strings. Three SGD lines, SGD1_sel, SGD2_sel and SGD3_sel are connected to the SGD transistors 701, 702 and 703, respectively, in the selected NAND strings and, optionally, to one another. Three SGS lines, SGS1_sel, SGS2_sel and SGS3_sel are connected the SGS transistors 731, 730 and 729, respectively, in the selected NAND strings and, optionally, to one another. Three SGD lines, SGD1_unsel, SGD2_unsel and SGD3_unsel are connected to the SGD transistors 741, 742 and 743, respectively, in the unselected NAND strings and, optionally, to one another. Three SGS lines, SGS1_unsel, SGS2_unsel and SGS3_unsel are connected to the SGS transistors 771, 770 and 769, respectively, in the unselected NAND strings and, optionally, to one another.

I_NS_sel is a current in NS_sel. The current is sensed by sensing circuitry 700 via a bit line 780 which is at a voltage, Vbl. A channel of NS_sel is ch_sel and has a voltage of Vch_sel. A channel of NS_unsel is ch_unsel and has a voltage of Vch_unsel (also referred to as Vch).

A common bit line 780 connects the drain end of the NAND strings to the sensing circuitry, which is used to sense NS_sel during a sensing operation. A source line 781 is connected to source ends of the NAND strings. Voltage drivers can be used to provide voltages on the control lines (e.g., word lines, select gate lines, bit line and source line).

The memory cells in NS_unsel can be classified according to their position in the NAND string. For example, a subset 790 of memory cells 754-758 (or the associated subset of word lines WLL13-WLL9) is in a midrange of the NAND string, a subset 791 of memory cells 745-753 (or the associated subset of word lines WLL22-WLL14) is at a drain-side of the NAND string, and a subset 792 of memory cells 759-767 (or the associated subset of word lines WLL8-WLL0) is at a source-side of the NAND string.

The midrange may encompass a word line which is centered between the drain-end and the source-side of the unselected NAND string. Optionally, a number of word lines on either side of the center word line can be included as well, up to about 5-20% of all of the word lines. In one approach, a selected word line is midrange between the drain-end of the unselected NAND string and the source-side of the unselected NAND string when the selected word line is among a subset 790 of the multiple word lines which is centered between the drain-end of the unselected NAND string and the source-end of the unselected NAND string, the subset comprising up to about 10-20% of the multiple word lines.

The source-side may encompass up to about 30-40% of all of the word lines, for example. For example, a selected word line may be at the source-side of the unselected NAND string when the selected word line is among a source-side subset 792 of the multiple word lines which is adjacent to the source-end of the unselected NAND string, the source-side subset comprising up to 40% of the multiple word lines. Also, the selected word line may be at the drain-side of the unselected NAND string when the selected word line is among a drain-side subset (791) of the multiple word lines which is adjacent to the drain-end of the unselected NAND string, the drain-side subset comprising up to 40% of the multiple word lines.

More detailed classifications can be made as well. For example, a subset 791*a* encompasses memory cells 745-748 at a first portion of the drain-side of the NAND string, and a subset 791*b* encompasses memory cells 749-753 at a second portion of the drain-side of the NAND string, where the first portion is closer than the second portion to the drain-end of NS_unsel at the bit line. A subset 792*a* encompasses memory cells 759-763 at a first portion of the source-side of the NAND string, and a subset 792*b* encompasses memory cells 764-767 at a second portion of the source-side of the NAND string, where the first portion is closer than the second portion to the source-end of NS_unsel at the source line.

In FIGS. 8A, 8B, 10, 11A-11D, 13A and 13B, the horizontal axis depicts Vth in V and the vertical axis depicts a number of memory cells on a logarithmic scale. The upper tail of the Vth distribution of cells in the erased state is depicted.

FIG. 8A depicts a plot of a Vth distribution for memory cells of WLsel+1, including a plot 800 where the SGS transistor is conductive and SGD is non-conductive, a plot 801 where the SGS and SGD transistors are non-conductive and the SGS transistor is underdriven by a smaller amount than the SGD transistor, and a plot 802 where the SGS and SGD transistors are non-conductive and the SGS transistor is underdriven by a same amount as the SGD transistor, where the amount of read stress is relatively small. The underdrive of a transistor is the gate bias minus the threshold voltage. For a transistor in the non-conductive state, the underdrive is typically a negative value. The underdrive is a measure of how strongly the transistor is cut off.

The data is from a midrange word line. A worst case condition was examined in which the memory cells of the unselected NAND strings on WLsel are in the highest programmed state, e.g., the C state, and the memory cells of the unselected NAND strings on WLsel−1 and WLsel+1 are in the erased state. The Vth distribution shown is for the unselected memory cells on WLsel+1 in the erased state. When the SGS transistor is conductive (plot 800), there is a large amount of read disturb. However, when source-side is non-conductive, the HEI read disturb becomes lower (plot 801). Moreover, the HEI read disturb becomes even lower (plot 802) when the underdrive of the SGS transistor is stronger. A conclusion is that the HEI read disturb will be prominent if the SGD and SGS underdrive is not balanced, and the read disturb will exist on the side of the channel with the stronger underdrive.

FIG. 8B depicts a plot of a Vth distribution similar to FIG. 8A except that it is for memory cells of WLsel−1. This data is the counterpart to plots 801 and 802, and shows that read disturb is very small for the unselected memory cells of WLsel−1 even when the read disturb is large for the unselected memory cells of WLsel+1.

Figure 9A:
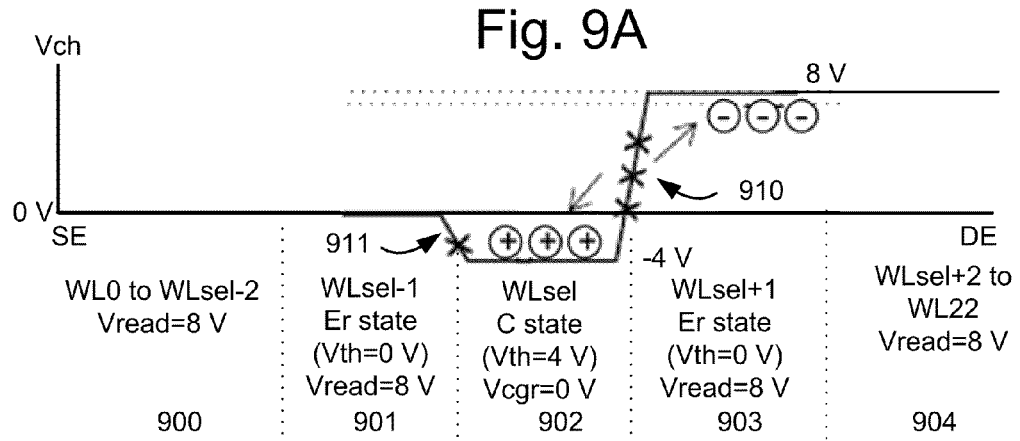
FIG. 9A depicts a plot of channel voltage (Vch) in an unselected NAND string, for a case where the SGS transistor is conductive and the SGD transistor is non-conductive, during the increase in Vpass.

FIG. 9A depicts a plot of channel voltage (Vch) in an unselected NAND string, for a case where the SGS transistor is conductive and the SGD transistor is non-conductive, during the increase in Vpass. A time which is immediately after the increase in Vpass is depicted, when Vpass has reached its peak. The NAND string has a source end (SE) and a drain end (DE). FIG. 9A to 9D are aligned with one another. In FIGS. 9A to 9D, 12A to 12D and 14A to 14E, the horizontal axis depicts a position along the channel and the vertical axis depicts a voltage in the channel (Vch). The scale of the horizontal axis is such that the portions of the channel directly under WLsel−1, WLsel and WLsel+1, respectively, are emphasized. Additionally, circles with a "+" represent holes, circles with a "−" represent electrons and "x" represents a location of electron-hole generation due to a gradient in Vch.

The portions 900, 901, 902, 903 and 904 of the channel are directly under WL0 to WLsel−2, WLsel−1, WLsel, WLsel+1, and WLsel+2 to WL22, respectively. As an example, the memory cell connected to WLsel is in the highest programmed state, e.g., the C state, with a Vth of 4 V, and the memory cells connected to WLsel−1 and WLsel+1 are in the erased state, with a Vth of 0 V. Also, Vsl=0 V, Vwl_sel=0 V, and WL0 to WLsel−1 and WLsel+1 to WL22−1 are increased from 0 V to 8 V according to Vpass. Since the SGS transistor is conductive and Vsl=0 V, the channel portions 900 and 901 are at Vch=0 V. Since the SGD transistor is non-conductive, the portions 903 and 904 of the channel are capacitively coupled up to 8 V, for instance, by the increase in Vpass. Moreover, the channel portion 902 has a low Vch, e.g., −4 V, due to Vwl_sel=0 V and Vth=0 V for the associated memory cell. In this case, the voltage in the portion of a channel directly under a memory cell is Vch=Vwl−Vth, where Vwl is the associated word line voltage and Vth is the Vth of the memory cell.

There is a gradient 910 in Vch between WLsel and WLsel+1 which causes electron-hole pairs to be generated in the channel. The electrons moves into the charge-trapping layer of the memory cell associated with WLsel+1, causing HEI read disturb. The holes move toward the channel portion 902. This gradient is relatively large, having a magnitude of 8−(−4)=12 V. A gradient 911 in Vch is also formed in the channel between WLsel and WLsel−1, but this is of a smaller magnitude.

Figure 9B:
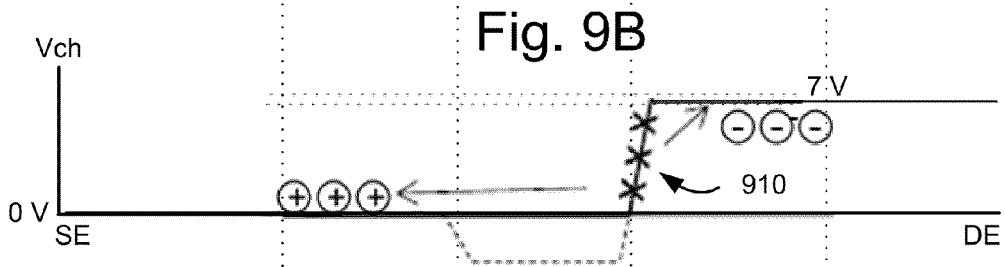
FIG. 9B depicts a plot of Vch in the unselected NAND string of FIG. 9A in a next moment in time.

FIG. 9B depicts a plot of Vch in the unselected NAND string of FIG. 9A in a next moment in time (when Vpass has reached its peak). The holes move in the channel toward the source-side of WLsel−1 and the channel portion 902 is driven toward Vsl=0 V. Vch remains at a high level such as 7 V for the channel portion 903 and therefore continues to cause read disturb of the associated memory cells.

Figure 9C:
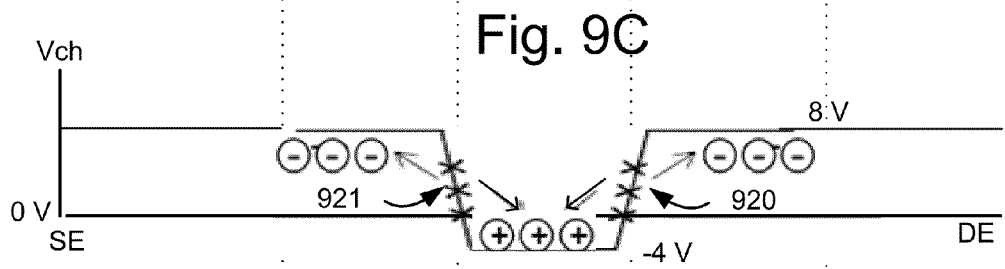
FIG. 9C depicts a plot of Vch in an unselected NAND string, for a case where the SGS transistor and SGD transistor are non-conductive and are underdriven by a same amount, during the increase in Vpass.

FIG. 9C depicts a plot of Vch in an unselected NAND string, for a case where the SGS transistor and SGD transistor are non-conductive and are underdriven by a same amount, during the increase in Vpass. A time which is immediately after the increase in Vpass is depicted, when Vpass has reached its peak. The channel regions 900, 901, 903 and 904 are capacitively coupled higher due to the increase in Vpass. A channel gradient 920 causes electron-hole generation where the electrons and holes moved toward the channel portions 903 and 902, respectively. Similarly, a channel gradient 921 causes electron-hole generation where the electrons and holes moved toward the channel portions 901 and 902, respectively. HEI disturb occurs for the memory cells connected to WLwel+1 and WLsel−1.

Figure 9D:
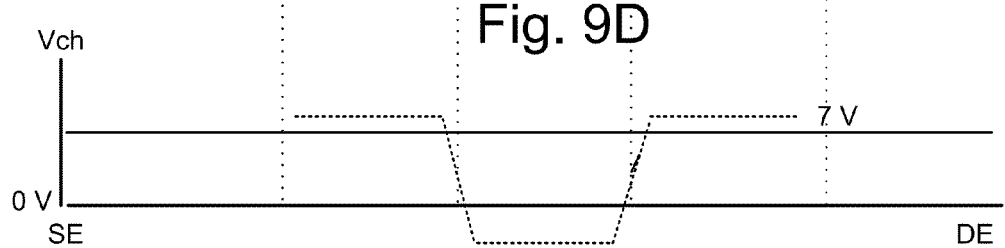
FIG. 9D depicts a plot of Vch in the unselected NAND string of FIG. 9C, in a next moment in time.

FIG. 9D depicts a plot of Vch in the unselected NAND string of FIG. 9C, in a next moment in time. The Vch of the channel portion 902 combines with the Vch of the surrounding channel portions to form a uniform Vch, e.g., 7 V, throughout the length of the channel. Since there is no large gradient in Vch, there is no HEI read disturb.

Generally, in FIGS. 9A and 9C, holes fill in the channel portion 902 below WLsel very quickly since the channel capacitance of this single word line is relatively small compared to the capacitance of the entire channel. Electron injection occurs on the WLsel+1 side of WLsel in FIGS. 9A and 9B, or on both sides of WLsel in FIG. 9C. Initially, at the end of the increase in Vpass, the read disturb is small since the elapsed time is small. However, after the channel portion 902 is filled by the holes, electron injection on WLsel+1 continues due to the existence of the Vch gradient 910 in FIG. 9B. Since the capacitance on the channel portions 900, 901, 903 and 904 on the source and drain-sides of WLsel is much larger than the capacitance of the channel portion 902 under WLsel, additional time is needed to discharge the channel voltage, so the majority of the disturb occurs at this period of time. In contrast, in FIG. 9D, no voltage gradient exists so no further electron injection occurs.

FIG. 10 depicts a plot of a Vth distribution for memory cells of various unselected word lines near a selected word line, for a case where the SGS transistor and SGD transistor are non-conductive and are underdriven by a same amount, where the amount of read stress is relatively large. WLn+1 to WLn+4 are word lines on the drain-side of WLsel (e.g., WLn) and WLn−1 to WLn−4 are word lines on the source-side of WLsel. Read stress occurs for memory cells as they experience read cycles, e.g., read operations. When the read stress (or total stress time) increases, disturb on both WLn+1 and WLn−1 becomes discernable (as indicated by a portion 810 of the plot). The fact that both WLn+1 and WLn−1 see the same amount of disturb indicates the electrons causing the disturb are from electron-hole generation due to the voltage gradient in the channel between WLn/WLn+1 and WLn/WLn−1. Memory cells of other word lines which are non-adjacent with WLsel do not see this disturb since both the drain-side and source-side remain boosted with some boosting voltage.

Figure 11A:
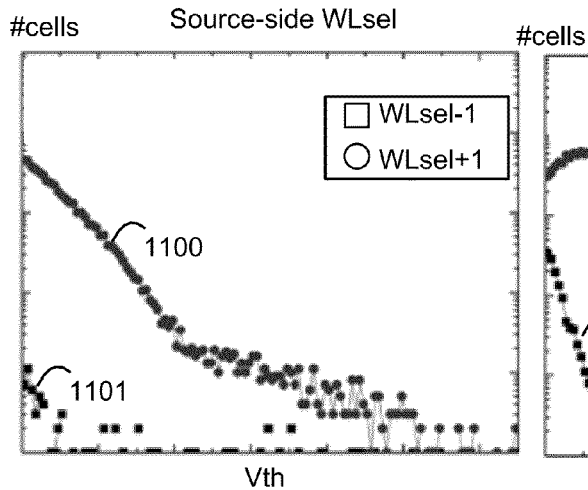
FIG. 11A depicts a plot of a Vth distribution for memory cells of WLsel+1 (1101) and WLsel−1 (1100), where the selected word line (WLsel) is source-side, the SGS transistor and SGD transistor are non-conductive and are underdriven by a same amount, and the amount of read stress is relatively large.

FIG. 11A depicts a plot of a Vth distribution for memory cells of WLsel+1 (1101) and WLsel−1 (1100), where the selected word line (WLsel) is source-side, the SGS transistor and SGD transistor are non-conductive and are underdriven by a same amount, and the amount of read stress is relatively large. When WLsel is close to the source-side of the NAND strings (e.g., the data is for WL3), a worse disturb is observed on WLsel+1 than on WLsel−1.

Figure 11D:
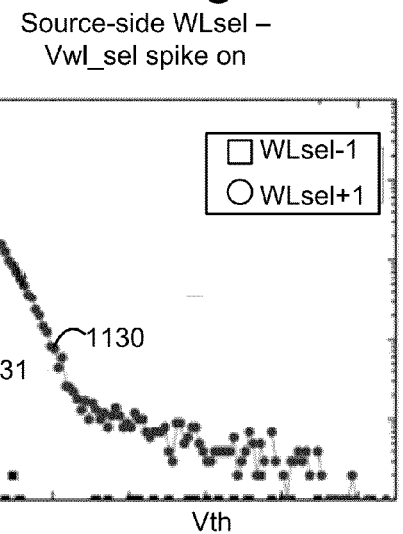
FIG. 11D depicts a plot of a Vth distribution for memory cells of WLsel+1 (1130) and WLsel−1 (1131), under similar conditions as in FIG. 11A except that a spike is provided in Vwl_sel during the increase in Vpass.
Figure 11B:
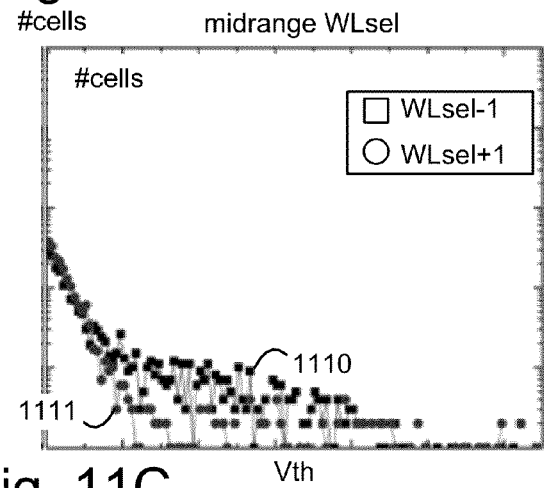
FIG. 11B depicts a plot of a Vth distribution for memory cells of WLsel+1 (1111) and WLsel−1 (1110) under similar conditions as in FIG. 11A except that WLsel is midrange.

FIG. 11B depicts a plot of a Vth distribution for memory cells of WLsel+1 (1111) and WLsel−1 (1110) under similar conditions as in FIG. 11A except that WLsel is midrange. For the midrange WL_sel (e.g., the data is for WL11), the boosting voltage on the source-side and drain-side is balanced since the channel capacitance on the source-side and drain-side is also balanced. This makes the disturb on WLn+1 and WLn−1 equal.

Figure 11C:
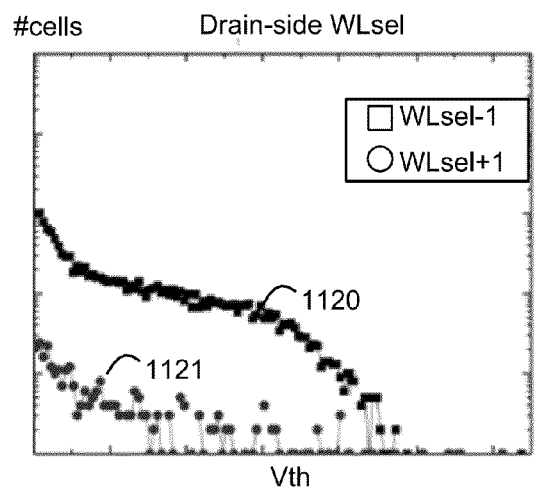
FIG. 11C depicts a plot of a Vth distribution for memory cells of WLsel+1 (1121) and WLsel−1 (1120) under similar conditions as in FIG. 11A except that WLsel is drain-side.

FIG. 11C depicts a plot of a Vth distribution for memory cells of WLsel+1 (1121) and WLsel−1 (1120) under similar conditions as in FIG. 11A except that WLsel is drain-side. When WLsel is close to the drain-side of the NAND strings (e.g., the data is for WL19), a worse disturb is observed on WLsel−1 than on WLsel+1. Thus, the disturb observed when stressing edge word lines can be significant.

FIG. 11D depicts a plot of a Vth distribution for memory cells of WLsel+1 (1130) and WLsel−1 (1131), under similar conditions as in FIG. 11A except that a spike is provided in Vwl_sel during the increase in Vpass. See also FIGS. 14C to 14E and 15B. Due to the spike, the read disturb is increased for both WLsel−1 and WLsel+1. When the SGS and SGD transistors are cut off by the same under-drive, this reduces read disturb. However, a severe read disturb is still seen on edge word lines, and a spike in Vwl_sel does not improve the problem. A solution provided herein involves spiking Vsgd_unsel or Vsgs_unsel when WLsel is on the source or drain-side, respectively, of a NAND string. Spiking can be omitted when WLsel is midrange. This approach minimizes HEI read disturb for unselected memory cells on edge word lines or on word lines near the edge while also reducing the normal read disturb due to F-N tunneling on unselected memory cells of all word lines.

FIG. 12A depicts a plot of Vch in the unselected NAND string of FIG. 9A, in a next moment in time, where WLsel is source-side and there is no spike in Vsgd_unsel. FIG. 12A to 12D are aligned with one another. The portions 1200, 1201, 1202, 1203 and 1204 of the channel are directly under WL0 to WLsel−2, WLsel−1, WLsel, WLsel+1, and WLsel+2 to WL22, respectively. There is a gradient 1220 in Vch between WLsel and WLsel+1 which cause electron-hole pairs to be generated in the channel. The electrons moves into the charge-trapping layer of the memory cell associated with WLsel+1, causing HEI read disturb. The holes move toward the channel portions 1200 and 1201, resulting in a lower Vch for those channel portions, while Vch remains fairly high, e.g., 7 V in the channel portions 1203 and 1204. A large gradient 1220 therefore continues to generate electrons which disturb the memory cell associated with WLsel+1. The Vch for channel portions 1200 and 1201 is non-zero sue to some capacitive coupling.

FIG. 12B depicts a plot of Vch in the unselected NAND string of FIG. 9A, in a next moment in time, for a case where the SGS transistor and SGD transistor are non-conductive and are underdriven by a same amount, except that a spike is provided in Vsgd_unsel during the increase in Vpass, and where WLsel is source-side. The spike in Vsgd_unsel provides the SGD transistor in a conductive state briefly while Vpass is increasing, so that the capacitive coupling up of the channel portion on the drain-side of WLsel is temporarily halted. Additionally, the channel portion on the drain-side of WLsel will tend to move toward the voltage on the driven bit line. As a result, Vch for the channel portions 1203 and 1204 is lower when a spike in Vsgd_unsel is used than when a spike in Vsgd_unsel is not used. A small gradient 1230 in Vch might still exist in the channel between WLsel and WLsel+1, but it is insufficient to cause HEI disturb. Moreover, Vch can be positive and non-zero on the source and drain-sides of WLsel so that normal read disturb is also avoided. As an example, Vch=1 V for channel portions 1201 and 1202 and Vch=2 V for channel portions 1203 and 1204. This demonstrates the benefit of the spike. See FIG. 15C for an example spiked waveform for an SGS or SGD transistor.

The drain-side of a word line, channel portion or memory cell refers to a side which is between the word line, channel portion or memory cell, respectively, and the drain end of the NAND string. The source-side of a word line, channel portion or memory cell refers to a side which is between the word line, channel portion or memory cell, respectively, and the source end of the NAND string.

FIG. 12C depicts a plot of Vch in the unselected NAND string of FIG. 9A, in a next moment in time, where WLsel is drain-side. The holes move toward the channel portions 1203 and 1204, resulting in a lower Vch for those channel portions, while Vch remains fairly high, e.g., 7 V in the channel portions 1200 and 1201. A large gradient 1240 continues to generate electrons which disturb the memory cell associated with WLsel−1.

FIG. 12D depicts a plot of Vch in the unselected NAND string of FIG. 9A, in a next moment in time, for a case where the SGS transistor and SGD transistor are non-conductive and are underdriven by a same amount, except that a spike is provided in Vsgs during the increase in Vpass, and where WLsel is drain-side. The spike in Vsgs_unsel provides the SGS transistor in a conductive state briefly while Vpass is increasing, so that the capacitive coupling up of the channel portion on the source-side of WLsel is temporarily halted. Additionally, the channel portion on the source-side of WLsel will tend to move toward the voltage on the driven source line. As a result, Vch for the channel portions 1200 and 1201 is lower when a spike in Vsgs_unsel is used than when a spike in Vsgs_unsel is not used. A small gradient 1250 in Vch might still exist in the channel between WLsel−1 and WLsel, but it is insufficient to cause HEI disturb. Moreover, Vch can be positive and non-zero on the source and drain-sides of WLsel so that normal read disturb is also avoided. As an example, Vch=2 V for channel portions 1201 and 1202 and Vch=1 V for channel portions 1204 and 1205. This demonstrates the benefit of the spike.

Figure 13A:
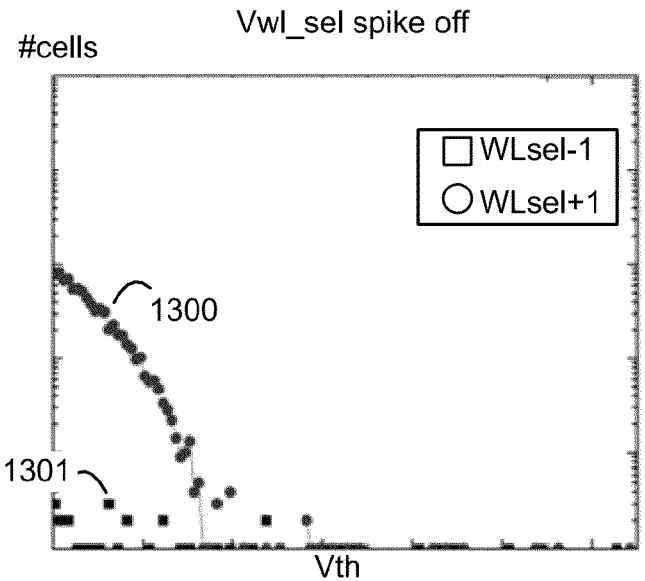
FIG. 13A depicts a plot of a Vth distribution for memory cells of WLsel+1 (1300) and WLsel−1 (1301), where WLsel is midrange, the SGS and SGD transistors are non-conductive and the SGS transistor is underdriven by a smaller amount than the SGD transistor, a spike is not provided in Vwl_sel during the increase in Vpass, and the amount of read stress is relatively small.

FIG. 13A depicts a plot of a Vth distribution for memory cells of WLsel+1 (1300) and WLsel−1 (1301), where WLsel is midrange, the SGS and SGD transistors are non-conductive and the SGS transistor is underdriven by a smaller amount than the SGD transistor, a spike is not provided in Vwl_sel during the increase in Vpass, and the amount of read stress is relatively small. When the SGS and SGD transistors are both non-conductive but with unbalanced underdrive, read disturb is prominent, even with low read stress. This demonstrates the benefit of a balanced underdrive.

Figure 13B:
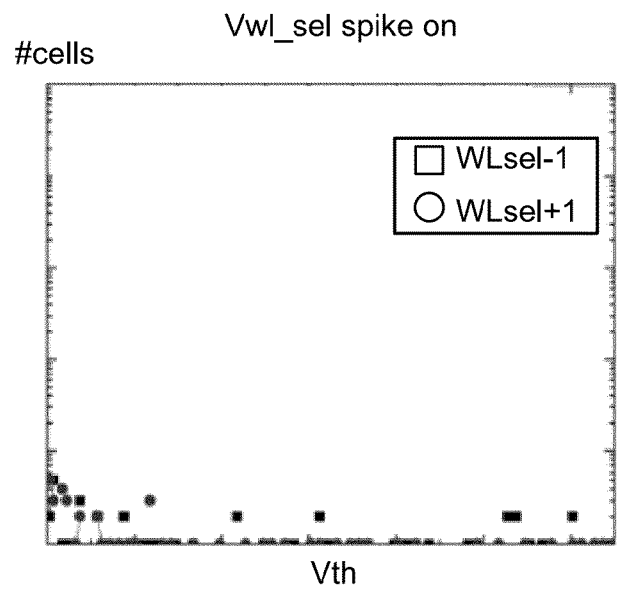
FIG. 13B depicts a plot of a Vth distribution for memory cells of WLsel+1 and WLsel−1 under similar conditions as in FIG. 13A except that a spike is provided in Vwl_sel during the increase in Vpass.

FIG. 13B depicts a plot of a Vth distribution for memory cells of WLsel+1 and WLsel−1 under similar conditions as in FIG. 13A except that a spike is provided in Vwl_sel during the increase in Vpass. The spike in the waveform on WLsel can have a similar shape as the spike for Vsgs or Vsgd. See FIG. 15B. A spike in Vwl_sel can substantially reduce HEI because it connects the channel voltage on the drain-side of WLsel to the channel voltage in the source-side of WLsel to balance out the voltages and reduce the Vch gradient. Read disturb is reduced, even with unbalanced underdrive of the SGS and SGD transistors.

Figure 14A:
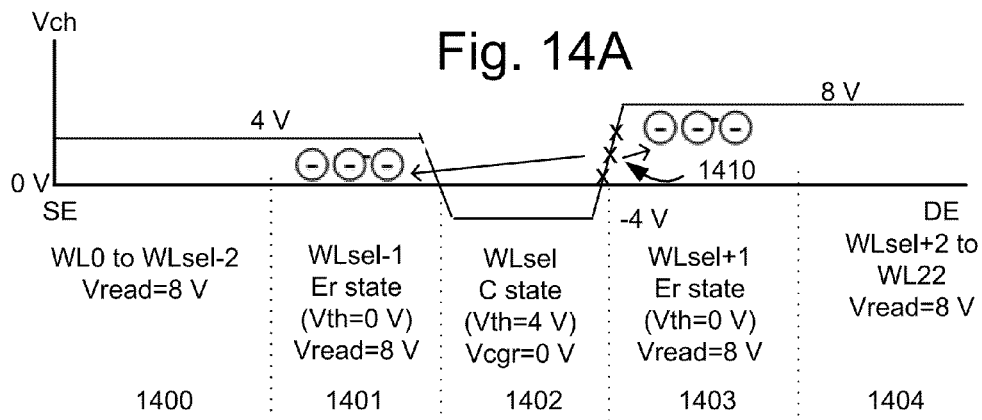
FIG. 14A depicts a plot of Vch in an unselected NAND string, for a case where the SGS and SGD transistors are non-conductive and the SGS transistor is underdriven by a smaller amount than the SGD transistor, during the increase in Vpass, where WLsel is midrange.

FIG. 14A depicts a plot of Vch in an unselected NAND string, for a case where the SGS and SGD transistors are non-conductive and the SGS transistor is underdriven by a smaller amount than the SGD transistor, during the increase in Vpass, where WLsel is midrange. FIG. 14A to 14E are aligned with one another. The portions 1400, 1401, 1402, 1403 and 1404 of the channel are directly under WL0 to WLsel−2, WLsel−1, WLsel, WLsel+1, and WLsel+2 to WL22, respectively. There is a gradient 1410 in Vch between WLsel and WLsel+1 which cause electron-hole pairs to be generated in the channel. The electrons moves into the charge-trapping layer of the memory cell associated with WLsel+1, causing HEI read disturb.

The holes move toward the channel portions 1400 and 1401, resulting in a lower Vch (e.g., 4 V) for those channel portions, while Vch remains fairly high, e.g., 8 V in the channel portions 1403 and 1404. The large gradient 1410 continues to generate electrons which disturb the memory cell associated with WLsel+1.

Figure 14B:
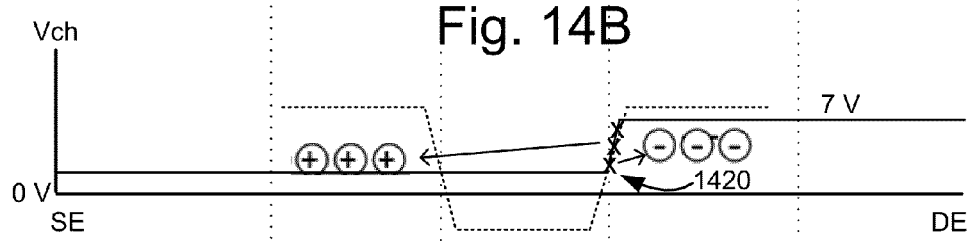
FIG. 14B depicts a plot of Vch in the unselected NAND string of FIG. 14A, in a next moment in time.

FIG. 14B depicts a plot of Vch in the unselected NAND string of FIG. 14A, in a next moment in time. The holes move in the channel toward the source-side of WLsel−1 and the channel portion 1402 is driven to a similar level as the channel portions 1400 and 1401. Vch remains at a high level such as 7 V for the channel portion 1403 so that a fairly large gradient 1420 still exists which continues to cause read disturb of the associated memory cells.

Figure 14C:
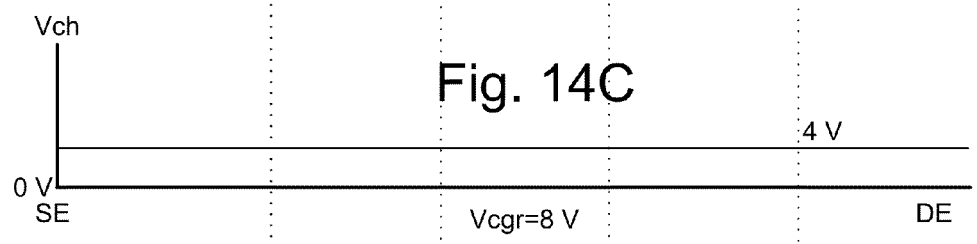
FIG. 14C depicts a plot of Vch in an unselected NAND string under similar conditions as in FIG. 14A except that a spike is provided in Vwl_sel during the increase in Vpass.

FIG. 14C depicts a plot of Vch in an unselected NAND string under similar conditions as in FIG. 14A except that a spike is provided in Vwl_sel during the increase in Vpass. The plot represents a time in which the spike is applied, e.g., at a high level such as 8 V. For example, in the spike, Vwl_sel may transition from 0 V to 8 V and back to 0 V. Due to the temporarily higher Vwl_sel during the spike, Vch in channel portion 1402 is similar to Vch in the other channel portions. That is, the spike in Vwl_sel allows the source-side and drain-side channel portions to communicate, so that Vch is roughly equalized for the channel portions on the source-side and drain-side of WLsel at a level such as 4 V.

Figure 14D:
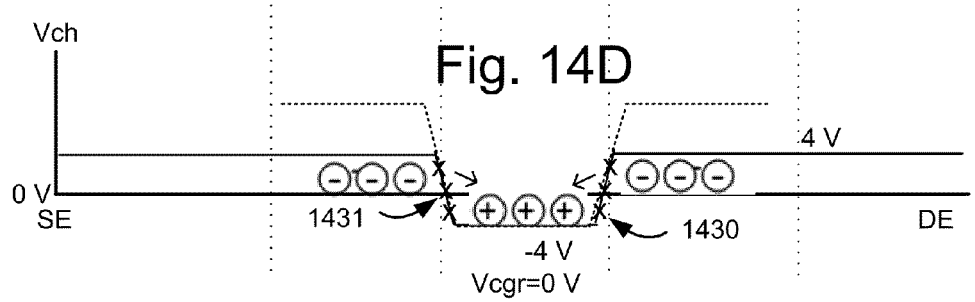
FIG. 14D depicts a plot of Vch in the unselected NAND string of FIG. 14C, at a first next moment in time.

FIG. 14D depicts a plot of Vch in the unselected NAND string of FIG. 14C, at a first next moment in time. When Vwl_sel returns to 0 V after the spike, large gradients 1430 and 1431 in Vch are formed between WLsel and WLsel+1, and between WLsel and WLsel−1, respectively. Electron-hole pairs are generated from both gradients, where the electrons can temporarily cause disturb of the memory cells of WLsel−1 and WLsel+1.

Figure 14E:
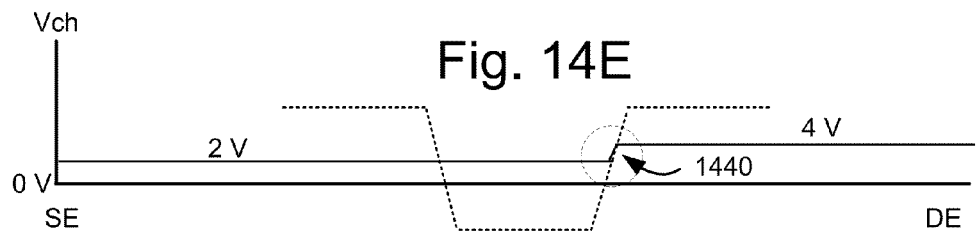
FIG. 14E depicts a plot of Vch in the unselected NAND string of FIG. 14D, at a second next moment in time.

FIG. 14E depicts a plot of Vch in the unselected NAND string of FIG. 14D, at a second next moment in time. Since the SGS transistor is underdriven by a smaller amount than the SGD transistor, a gradient 1440 will remain between WLsel and WLsel+1. However, it will be of a smaller magnitude than the gradients of FIG. 14D so that HEI disturb is avoided. This shows that the spike in Vwl_sel is helpful when the underdrive of the SGS and SGD transistors is unbalanced.

Figure 15A:
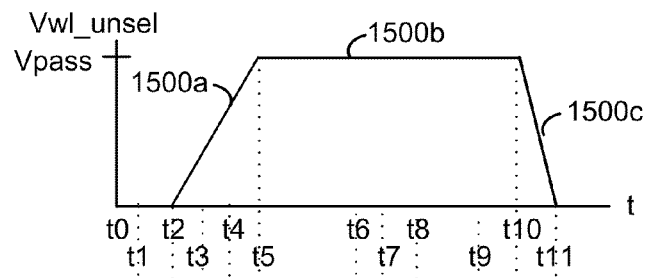
FIG. 15A depicts an example waveform in a sensing operation for Vwl_unsel, the voltage on unselected word lines.

FIG. 15A depicts an example waveform in a sensing operation for Vwl_unsel, the voltage on unselected word lines. The horizontal axes in FIG. 15A to 15G depict time and are aligned. A boosting phase of a sensing operation occurs from t2 to t5, when Vpass increases. The channel is then set at a boosted voltage (Vch) which remains in a sensing phase, from t6 to t11. Vch is roughly fixed from t5 to t10 but may decay slightly.

Vwl_unsel is at 0 V from t0-t2, increases from 0 V to a peak level from t2 to t5 (plot 1500a), is at the peak level from t5 to t10 (plot 1500b) and decreases back down to 0 V at t11 (plot 1500c). The increase in Vwl_unsel can be a controlled ramp up or a step increase. When Vwl_unsel=Vpass is applied to the unselected word lines, it provides the associated memory cells in a conductive state.

Figure 15B:
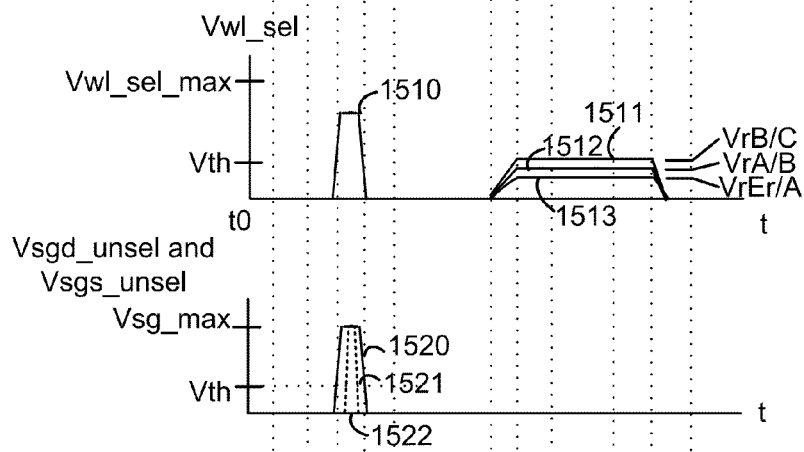
FIG. 15B depicts an example waveform in a sensing operation for Vwl_sel, the voltage on the selected word line.

FIG. 15B depicts an example waveform in a sensing operation for Vwl_sel, the voltage on the selected word line. Waveform 1510 depicts a spike in Vwl_sel. The spike increases at t3 to a peak level of Vwl_sel max and decreases back to 0 V at t4. When the spike is applied to the selected word line, it provides the associated memory cells in a conductive state. From t7 to t10, Vwl_sel can be provided at one of three control gate read levels, for instance, as discussed in FIG. 6. The example read levels are VrEr/A (plot 1513), VrA/B (plot 1512) and VrB/C (plot 1511). In another example, Vwl_wel can be set to different levels in turn. For example, verify tests may be performed with Vwl_sel at VvA, then VvB and then VvC.

Figure 15C:
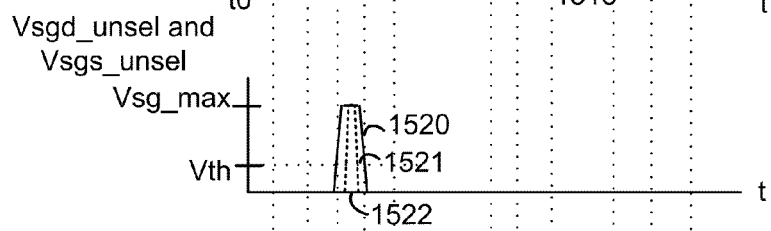
FIG. 15C depicts an example waveform in a sensing operation for Vsgd_unsel, the voltage on an SGD transistor of an unselected NAND string, and Vsgs_unsel, the voltage on an SGS transistor of an unselected NAND string.

FIG. 15C depicts an example waveform in a sensing operation for Vsgd_unsel, the voltage on an SGD transistor of an unselected NAND string, and Vsgs_unsel, the voltage on an SGS transistor of an unselected NAND string. Various options are possible. In one option, a waveform 1522 represents 0 V being applied from t0 to t11. This represents the case without a voltage spike. In another option, a spike 1520 is applied from t3 to t4. For example, the SGD transistor may have a voltage spike while the SGS transistor does not. Or, the SGS transistor may have a voltage spike while the SGD transistor does not. Or, both the SGD and SGS transistors may have a spike. A waveform 1521 represents another spike which has a smaller duration than the spike 1520. The duration of the spike can be optimized (see FIG. 16B). The spike reaches a peak level of Vsg_max which provides the associated transistors temporarily in a conductive state. Specifically, when the spike waveform is above the Vth of the SGD or SGS transistor, the SGD or SGS transistor is in a conductive state. The spike can occur any time during the increase in Vpass, e.g., at the start of the increase, e.g., from t2 to t3, midrange through the increase, e.g., from t3 to t4, or at the end of the increase, e.g., from t4 to t5. It is even possible for multiple spikes to be used during the increase in Vpass.

A spike in Vsgd_unsel allows a driven voltage on the bit line (Vbl) to reach the channel of the unselected NAND string, while a spike in Vsgs_unsel allows a driven voltage on the source line (Vsl) to reach the channel of the unselected NAND string. That is, the bit line communicates with the drain-end of the channel when the SGD transistor is conductive, and the source line communicates with the source-end of the channel when the SGS transistor is conductive.

In one approach, if the selected word line is at a source-side of the unselected NAND string, the method includes controlling the drain-end select gate (SGD transistor) of the unselected NAND string to, at different times during the applying of the increasing voltage, allow a driven voltage on the bit line to reach the channel of the unselected NAND string (e.g., from t3 to t4) and prevent the driven voltage on the bit line from reaching the channel of the unselected NAND string (e.g., from t2 to t3 and from t4 to t5). Or, if the selected word line is at a drain-side of the unselected NAND string, controlling the source-end select gate (SGS transistor) of the unselected NAND string to, at different times during the applying of the increasing voltage, allow a driven voltage on a source line to reach the channel of the unselected NAND string (e.g., from t3 to t4) and prevent the driven voltage on the source line from reaching the channel of the unselected NAND string (e.g., from t2 to t3 and from t4 to t5).

For the unselected NAND strings, the select gates are in a non-conductive state during the sensing phase to avoid interfering with the sensing of the selected NAND strings.

Figure 15D:
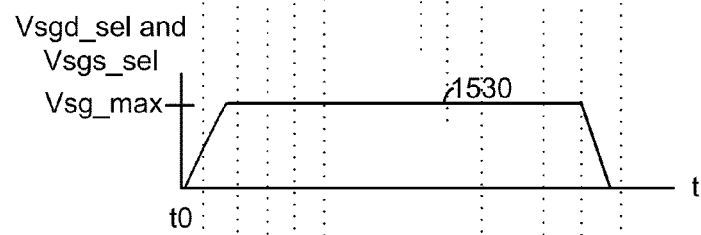
FIG. 15D depicts an example waveform in a sensing operation for Vsgd_sel, the voltage on an SGD transistor of a selected NAND string, and Vsgs_sel, the voltage on an SGS transistor of a selected NAND string.

FIG. 15D depicts an example waveform 1530 in a sensing operation for Vsgd_sel, the voltage on an SGD transistor of a selected NAND string, and Vsgs_sel, the voltage on an SGS transistor of a selected NAND string. These transistors can be provided at a peak level of Vsg_max to provide the SGD and SGS transistors in a conductive state which allows sensing of the current in the selected NAND string.

Figure 15E:
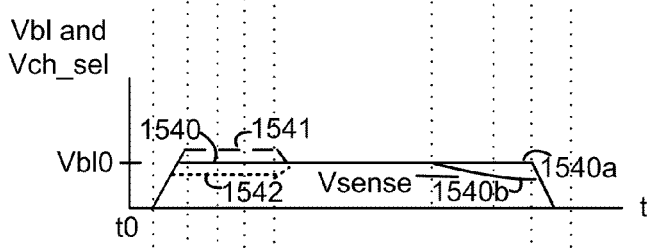
FIG. 15E depicts an example waveform in a sensing operation for Vbl, the voltage on a bit line which is connected to selected and unselected NAND strings, and Vch_sel, the voltage in the channel of a selected NAND string.

FIG. 15E depicts an example waveform in a sensing operation for Vbl, the voltage on a bit line which is connected to selected and unselected NAND strings, and Vch_sel, the voltage in the channel of a selected NAND string. Vbl0 is a desired bit line voltage for the sensing phase. Generally, the sensing circuitry is configured to use this voltage as a baseline, where the sensing is based on a voltage decay from the baseline. In one approach (line 1540), Vbl is at the same level during the boosting phase and the sensing phase. However, it is possible for Vbl to be higher (line 1541) or lower (1542) during the boosting phase than in the sensing phase. For example, during the spike of Vsgd_unsel, a relatively higher Vbl can result in a relatively higher Vch and a relatively lower Vbl can result in a relatively lower Vch. Thus, Vbl can be optimized during the boosting phase, separately from the sensing phase, based on the position of WLsel.

T9 is a sense time at which sensing circuitry associated with a selected NAND string determines a conductive state of the NAND string based on a current in the NAND string. Since Vwl_unsel causes the unselected memory cells in a NAND string to be in a conductive state, the conductive state of the NAND string as determined by sensing indicates the conductive state of the selected memory cell. With Vwl_sel applied to the selected memory cell, the conductive state of the NAND string indicates whether the Vth of the selected memory cell exceeds Vwl_sel. The NAND string is conductive if the Vth of the memory cell exceeds Vwl_sel. In one approach, Vbl decays below a level Vsense at t9 when the string is conductive, as represented by waveform 1540b and this decay is sensed by the sensing circuitry. Waveform 1540a represents the case where the string is not conductive, in which case Vbl does not decay below Vsense.

Generally, the voltage in the channel of the selected NAND string, Vch_sel, is set to Vbl when the associated SGD transistor is in a conductive state.

Figure 15F:
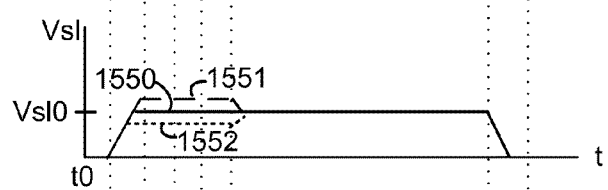
FIG. 15F depicts an example waveform in a sensing operation for Vsl, the voltage on a source line which is connected to selected and unselected NAND strings.

FIG. 15F depicts an example waveform in a sensing operation for Vsl, the voltage on a source line which is connected to selected and unselected NAND strings. Vsl0 is a desired source line voltage for the sensing phase. In one approach (line 1550), Vsl is at the same level during the boosting phase and the sensing phase. However, it is possible for Vsl to be higher (line 1551) or lower (1552) during the boosting phase than in the sensing phase. During the spike of Vsgd_unsel, a relatively higher Vsl can result in a relatively higher Vch and a relatively lower Vsl can result in a relatively lower Vch. Thus, Vsl can be optimized during the boosting phase, separately from the sensing phase, based on the position of WLsel.

Figure 15G:
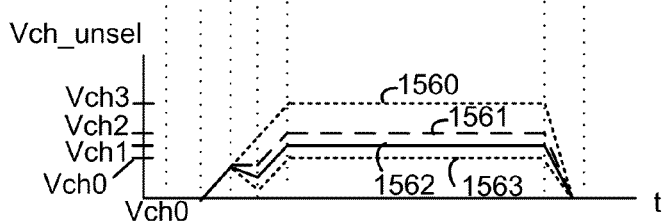
FIG. 15G depicts an example waveform in a sensing operation for Vch_unsel, the voltage in the channel of an unselected NAND string.

FIG. 15G depicts an example waveform in a sensing operation for Vch_unsel, the voltage in the channel of an unselected NAND string. Vch_unsel, increases when Vpass increase due to capacitive coupling, as mentioned. During a spike in Vsgd_unsel or Vsgs_unsel, the coupling is temporarily halted so that Vch_unsel may decrease, remain constant, or increase at a slower rate than when the spike is not present. For example, waveform 1560 represents a case with no spike, where Vch_unsel reaches a high level of Vch3 (which is too high and may cause a gradient which results in HEI disturb). Waveforms 1561, 1562 and 1563 represent cases with a spike, where Vch_unsel reaches Vch2, Vch1 or Vch0, respectively. The peak level of Vch_unsel can be optimized using factors such as spike duration, and the magnitude of Vbl and/or Vsl. Note also that the channel voltage can vary along the length of the channel. FIG. 15G depicts a representative channel voltage.

Figure 16A:
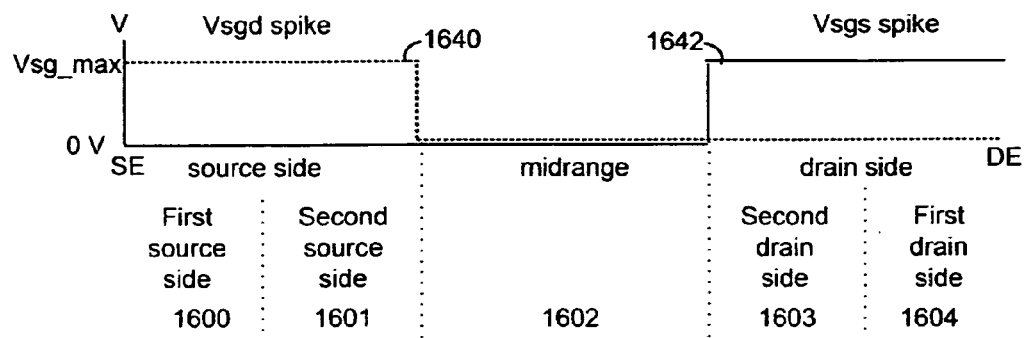
FIG. 16A depicts a plot showing a select gate voltage in a sensing operation as a function of a position of WLsel, where a Vsgd_unsel spike but no Vsgs_unsel spike is used if WLsel is source-side, no Vsgd or Vsgs_unsel spike is used if WLsel is midrange and a Vsgs_unsel spike but no Vsgd_unsel spike is used if WLsel is drain-side.
Figure 16B:
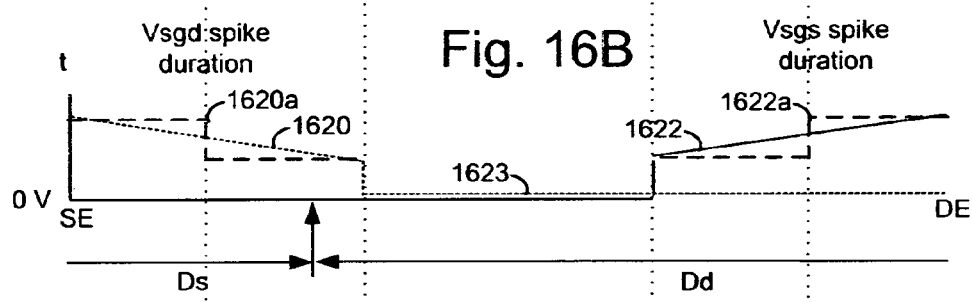
FIG. 16B depicts a plot showing a spike duration (time t) of a select gate voltage in a sensing operation as a function of a position of WLsel, where a Vsgd_unsel spike is used having a variable duration but no Vsgs_unsel spike is used if WLsel is source-side, no Vsgd or Vsgs_unsel spike is used if WLsel is midrange and a Vsgs_unsel spike is used having a variable duration based, but no Vsgd_unsel spike is used if WLsel is drain-side.
Figure 16C:
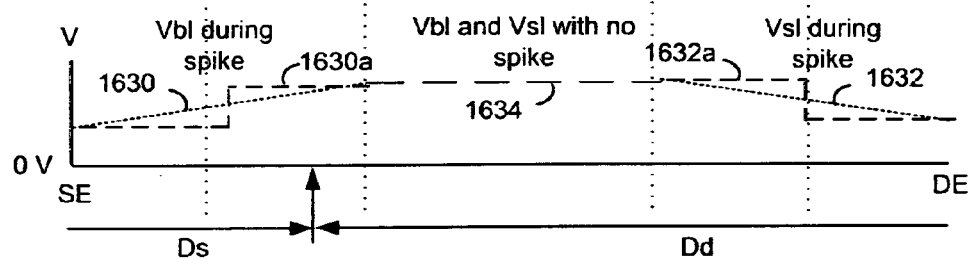
FIG. 16C depicts a plot showing a select gate voltage in a sensing operation as a function of a position of WLsel, where a Vsgd_unsel spike is used in which Vbl has a variable magnitude but no Vsgs_unsel spike is used if WLsel is source-side, no Vsgd or Vsgs_unsel spike is used if WLsel is midrange, and a Vsgs_unsel spike is used in which Vsl has a variable magnitude but no Vsgd_unsel spike is used if WLsel is drain-side.

In FIG. 16A to 16C, the horizontal axes are aligned and represent a position along the length of a channel of an unselected NAND string. The vertical axis represents a voltage.

Channel portions 1600 and 1601 are on a source-side of the unselected NAND string, channel portions 1603 and 1604 are on a drain-side of the unselected NAND string, and a channel portion 1602 is midrange in the unselected NAND string. As an example, the source-side is subdivided into regions such as a first source-side region 1600, relatively close to the SE, and a second source-side region 1601, relatively far from the SE. The drain-side is subdivided into regions such as a first drain-side region (channel portion 1604), relatively close to the DE, and a second drain region (channel portion 1603), relatively far from the DE. The channel portions 1600, 1601, 1602, 1603 and 1604 may correspond to the word line subsets 792b, 792a, 790, 791b and 791a, respectively, of FIG. 7.

FIG. 16A depicts a plot showing a select gate voltage in a sensing operation as a function of a position of WLsel, where a Vsgd_unsel spike but no Vsgs_unsel spike is used if WLsel is source-side, no Vsgd or Vsgs_unsel spike is used if WLsel is midrange and a Vsgs_unsel spike but no Vsgd_unsel spike is used if WLsel is drain-side. A plot 1640 represents Vsgd_unsel, and a plot 1642 represents Vsgs_unsel. Vsgd_unsel or Vsgs_unsel may have a peak value of Vsg_max, as discussed in connection with FIG. 15C.

FIG. 16B depicts a plot showing a spike duration (time t) of a select gate voltage in a sensing operation as a function of a position of WLsel, where a Vsgd_unsel spike is used having a variable duration but no Vsgs_unsel spike is used if WLsel is source-side, no Vsgd or Vsgs_unsel spike is used if WLsel is midrange and a Vsgs_unsel spike is used having a variable duration based, but no Vsgd_unsel spike is used if WLsel is drain-side. Plots 1620 and 1620a represent the Vsgd_unsel spike duration increasing gradually, or step-wise, respectively, in proportion to Dd, the distance of WLsel from DE, when WLsel is source-side. Plots 1622 and 1622a represent the Vsgs_unsel spike duration increasing gradually, or step-wise, respectively, in proportion to Ds, the distance of WLsel from SE, when WLsel is drain-side. Line 1623 represents no spike in Vsgd_unsel or Vsgs_unsel when WLsel is midrange.

Therefore, if WLsel is at the source-side of the unselected NAND string (e.g., WL subsets 792b and 792a of FIG. 7, associated with channel portions 1600 and 1601, respectively), the driven voltage on the bit line (Vbl) is allowed to reach the channel of the unselected NAND string for a duration during the applying of the increasing voltage (Vpass) which is inversely proportional to a distance (Ds) of the selected word line from the source-end of the unselected NAND string.

If WLsel is at the drain-side of the unselected NAND string, (e.g., WL subsets 791b and 791a of FIG. 7, associated with channel portions 1603 and 1604, respectively) the driven voltage on the source line (Vsl) is allowed to reach the channel of the unselected NAND string for a duration during the applying of the increasing voltage which is inversely proportional to a distance (Dd) of the selected word line from the drain-end of the unselected NAND string.

In the case of plot 1622a, the multiple word lines comprise different adjacent subsets of word lines; the selected word line is in one of the subsets of word lines; and if the selected word line is at the drain-side of the unselected NAND string, the driven voltage on the source line is allowed to reach the channel of the unselected NAND string for a duration (e.g., the duration of the spike in Vsgs_unsel) during the applying of the increasing voltage (Vpass) which is a function of a position of the one of the subsets among the different adjacent subsets.

In the case of plot 1620a, the multiple word lines comprise different adjacent subsets (1600, 1601) of word lines; the selected word line is in one of the subsets of word lines; and if the selected word line is at the source-side of the unselected NAND string, the driven voltage on the bit line is allowed to reach the channel of the unselected NAND string for a duration (e.g., the duration of the spike in Vsgd_unsel) during the applying of the increasing voltage (Vpass) which is a function of a position of the one of the subsets among the different adjacent subsets.

FIG. 16C depicts a plot showing a select gate voltage in a sensing operation as a function of a position of WLsel, where a Vsgd_unsel spike is used in which Vbl has a variable magnitude but no Vsgs_unsel spike is used if WLsel is source-side, no Vsgd or Vsgs_unsel spike is used if WLsel is midrange and a Vsgs_unsel spike is used in which Vsl has a variable magnitude but no Vsgd_unsel spike is used if WLsel is drain-side. Plots 1630 and 1630a represent the Vbl magnitude during a spike in Vsgd_unsel decreasing gradually, or step-wise, respectively, in proportion to Dd, the distance of WLsel from DE, when WLsel is source-side. Plots 1632 and 1632a represent the Vsl magnitude during a spike in Vsgs_unsel decreasing gradually, or step-wise, respectively, in proportion to Ds, the distance of WLsel from SE, when WLsel is drain-side. Line 1634 represents a fixed magnitude for Vbl and Vsl when WLsel is midrange and there is no spike in Vsgd_unsel or Vsgs_unsel.

Therefore, if the selected word line is at the source-side of the unselected NAND string, a magnitude of the driven voltage on the bit line (Vbl), when this voltage is allowed to reach the channel, of the unselected NAND string is proportional to a distance (Ds) of the selected word line from the source-end of the unselected NAND string.

If the selected word line is at the drain-side of the unselected NAND string, a magnitude of the driven voltage on the source line (Vsl), when this voltage is allowed to reach the channel of the unselected NAND string, is proportional to a distance (Dd) of the selected word line from the drain-end of the unselected NAND string.

In the case of plot 1632a, the multiple word lines comprise different adjacent subsets (1603, 1604) of word lines; the selected word line is in one of the subsets of word lines; and if the selected word line is at the drain-side of the unselected NAND string, a magnitude of the driven voltage on the source line, when this voltage is allowed to reach the channel of the unselected NAND string, is set as a function of a position of the one of the subsets among the different adjacent subsets.

In the case of plot 1630a, the multiple word lines comprise different adjacent subsets (1600, 1601) of word lines; the selected word line is in one of the subsets of word lines; and if the selected word line is at the source-side of the unselected NAND string, a magnitude of the driven voltage on the bit line, when this voltage is allowed to reach the channel of the unselected NAND string, is set as a function of a position of the one of the subsets among the different adjacent subsets.

Accordingly, it can be seen that, in one embodiment, a method for performing a sensing operation in a 3D stacked non-volatile memory device comprises: performing a boosting phase of the sensing operation, the boosting phase sets a boosting voltage of a channel of an unselected NAND string in the memory device, the unselected NAND string having a drain-end select gate at a drain-end of the unselected NAND string and a source-end select gate at a source-end of the unselected NAND string; after the boosting voltage is set, performing a sensing phase of the sensing operation, the sensing phase senses a current in a selected NAND string of the memory device, the selected NAND string having a drain-end select gate at a drain-end of the selected NAND string and a source-end select gate at a source-end of the selected NAND string; wherein: the memory device comprises multiple word lines of memory cells including a selected word line and unselected word lines; and during the sensing phase, the current is sensed via a bit line which is connected to the drain-end of the selected NAND string and the drain-end of the unselected NAND string while one or more read voltages are applied to the selected word line; wherein the setting of the boosting voltage comprises: applying an increasing voltage to the unselected word lines; if the selected word line is at a source-side of the unselected NAND string, controlling the drain-end select gate of the unselected NAND string to, at different times during the applying of the increasing voltage, allow a driven voltage on the bit line to reach the channel of the unselected NAND string and prevent the driven voltage on the bit line from reaching the channel of the unselected NAND string; and if the selected word line is at a drain-side of the unselected NAND string, controlling the source-end select gate of the unselected NAND string to, at different times during the applying of the increasing voltage, allow a driven voltage on a source line to reach the channel of the unselected NAND string and prevent the driven voltage on the source line from reaching the channel of the unselected NAND string.

In another embodiment, a memory controller comprises: a storage device comprising a set of instructions, and a processor operable to execute the set of instructions. The set of instructions comprises: instructions to apply an increasing voltage to unselected memory cells in unselected word lines of a memory device in connection with a sensing operation involving a selected memory cell in a selected word line of the memory device, wherein the selected memory cell is in a selected NAND string of the memory device and unselected memory cells are in an unselected NAND string of the memory device; instructions to control a select gate of the unselected NAND string to, at different times during the applying of the increasing voltage, allow a driven voltage on a bit line to reach a channel of the unselected NAND string and prevent the driven voltage on the bit line from reaching the channel of the unselected NAND string, wherein the select gate is at a drain-end of the unselected NAND string if the selected word line is at a source-side of the unselected NAND string and the select gate is at a source-end of the unselected NAND string if the selected word line is at a drain-side of the unselected NAND string, wherein a boosting voltage is set in the channel of the unselected NAND string based on the control of the select gate; and instructions to sense a current in the selected NAND string via the bit line while the boosting voltage is set in the channel of the unselected NAND string.

In another embodiment, a 3D stacked non-volatile memory device comprises: multiple word lines of memory cells including a selected word line and unselected word lines; an unselected NAND string comprising a drain-end select gate at a drain-end of the unselected NAND string and a source-end select gate at a source-end of the unselected NAND string; a selected NAND string comprising a drain-end select gate at a drain-end of the selected NAND string and a source-end select gate at a source-end of the selected NAND string; a bit line which is connected to the drain-end of the selected NAND string and the drain-end of the unselected NAND string; and a control circuit. The control circuit is configured to: (a) perform a boosting phase of a sensing operation, the boosting phase sets a boosting voltage of a channel of the unselected NAND string, wherein to set the boosting voltage, the control circuit is configured to: (i) apply an increasing voltage to the unselected word lines, (ii) if the selected word line is at a source-side of the unselected NAND string, control the drain-end select gate of the unselected NAND string to, at different times during the increasing voltage, allow a driven voltage on the bit line to reach the channel of the unselected NAND string and prevent the driven voltage on the bit line from reaching the channel of the unselected NAND string, and (iii) if the selected word line is at a drain-side of the unselected NAND string, control the source-end select gate of the unselected NAND string to, at different times during the increasing voltage, allow a driven voltage on a source line to reach the channel of the unselected NAND string and prevent the driven voltage on the source line from reaching the channel of the unselected NAND string, and (b) after the boosting voltage is set, perform a sensing phase of the sensing operation, the sensing phase senses a current in the selected NAND string via the bit line while one or more read voltages are applied to the selected word line.

In another embodiment, a 3D stacked non-volatile memory device comprises: multiple word lines of memory cells including a selected word line and unselected word lines; an unselected NAND string comprising a drain-end select gate at a drain-end of the unselected NAND string and a source-end select gate at a source-end of the unselected NAND string; a selected NAND string comprising a drain-end select gate at a drain-end of the selected NAND string and a source-end select gate at a source-end of the selected NAND string; a selected memory cell connected to the selected word line, the selected memory cells is in the selected NAND string; unselected memory cells connected to the unselected word line, the unselected memory cells are in the selected NAND string and in the unselected NAND string; a bit line which is connected to the drain-end of the selected NAND string and the drain-end of the unselected NAND string; and a control circuit. The control circuit is configured to: apply an increasing voltage to the unselected memory cells via the unselected word lines in connection with a sensing operation involving the selected memory cell; during one portion of a time period in which the increasing voltage occurs, control the drain-end select gate of the unselected NAND string and the source-end select gate of the unselected NAND string to float a voltage of a channel of the unselected NAND string, to allow the voltage of the channel to increase due to capacitive coupling from the increasing voltage; during another portion of the time period in which the increasing voltage occurs, if the selected word line is at a source-side of the unselected NAND string, control the drain-end select gate end of the unselected NAND string to connect the channel of the unselected NAND string to a driven voltage on the bit line, to prevent an increase in the voltage of the channel of the unselected NAND string due to capacitive coupling, wherein the driven voltage on the bit line is connected to the channel of the unselected NAND string for a duration during the time period in which the increasing voltage occurs, and the duration is inversely proportional to a distance of the selected word line from the source-end of the unselected NAND string; and after the time period, sense a current in the selected NAND string via the bit line.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for performing a sensing operation in a non-volatile memory device, the method comprising:

performing a boosting phase of the sensing operation, the boosting phase sets a boosting voltage of a channel of an unselected NAND string in the memory device, the unselected NAND string comprising a drain-end select gate at a drain-end of the unselected NAND string and a source-end select gate at a source-end of the unselected NAND string;

after the boosting voltage is set, performing a sensing phase of the sensing operation, the sensing phase senses a current in a selected NAND string of the memory device, the selected NAND string comprising a drain-end select gate at a drain-end of the selected NAND string and a source-end select gate at a source-end of the selected NAND string; wherein:

the memory device comprises multiple word lines of memory cells including a selected word line and unselected word lines;

the selected NAND string and the unselected NAND strings each comprise a charge-trapping layer and a polysilicon channel layer which extend vertically in a three-dimensional stacked memory structure; and during the sensing phase, the current is sensed via a bit line which is connected to the drain-end of the selected NAND string and the drain-end of the unselected NAND string while one or more read voltages are applied to the selected word line;

wherein the performing the boosting phase comprises:

applying an increasing voltage to the unselected word lines;

if the selected word line is at a source-side of the unselected NAND string, controlling the drain-end select gate of the unselected NAND string to, at different times during the applying of the increasing voltage, allow a driven voltage on the bit line to reach the channel of the unselected NAND string by providing the drain-end select gate of the unselected NAND string in a conductive state and prevent the driven voltage on the bit line from reaching the channel of the unselected NAND string by providing the drain-end select gate of the unselected NAND string in a non-conductive state;

if the selected word line is at a drain-side of the unselected NAND string, controlling the source-end select gate of the unselected NAND string to, at different times during the applying of the increasing voltage, allow a driven voltage on a source line to reach the channel of the unselected NAND string by providing the source-end select gate of the unselected NAND string in a conductive state and prevent the driven voltage on the source line from reaching the channel of the unselected NAND string by providing the source-end select gate of the unselected NAND string in a non-conductive state; and if the selected word line is midrange between the drain-end of the unselected NAND string and the source-end of the unselected NAND string, preventing the driven voltage on the bit line from reaching the channel of the unselected NAND string throughout the applying of the increasing voltage by providing the drain-end select gate of the unselected NAND string in a non-conductive state, and preventing the driven voltage on the source line from reaching the channel of the unselected NAND string throughout the applying of the increasing voltage by providing the source-end select gate of the unselected NAND string in a non-conductive state.

2. The method of claim 1, wherein:
the selected word line is midrange between the drain-end of the unselected NAND string and the source-side of the unselected NAND string when the selected word line is among a subset of the multiple word lines which is centered between the drain-end of the unselected NAND string and the source-end of the unselected NAND string, the subset comprising up to 20% of the multiple word lines.

3. The method of claim 1, further comprising:
if the selected word line is at the source-side of the unselected NAND string, providing memory cells connected to the selected word line in a conductive state while the driven voltage on the bit line is allowed to reach the channel of the unselected NAND string; and if the selected word line is at the drain-side of the unselected NAND string, providing the memory cells connected to the selected word line in the conductive state while the driven voltage on the source line is allowed to reach the channel of the unselected NAND string.

4. The method of claim 1, further comprising:
if the selected word line is at the source-side of the unselected NAND string, providing the source-end select gate of the unselected NAND string in a non-conductive state to prevent the driven voltage on the source line from reaching the channel of the unselected NAND string throughout the applying of the increasing voltage.

5. The method of claim 1, further comprising:
if the selected word line is at the drain-side of the unselected NAND string, providing the drain-end select gate of the unselected NAND string in a non-conductive state to prevent the driven voltage on the bit line from reaching the channel of the unselected NAND string throughout the applying of the increasing voltage.

6. The method of claim 1, wherein:
the selected word line is at the source-side of the unselected NAND string when the selected word line is among a source-side subset of the multiple word lines which is adjacent to the source-end of the unselected NAND string, the source-side subset comprising up to 40% of the multiple word lines; and the selected word line is at the drain-side of the unselected NAND string when the selected word line is among a drain-side subset of the multiple word lines which is adjacent to the drain-end of the unselected NAND string, the drain-side subset comprising up to 40% of the multiple word lines.

7. The method of claim 1, wherein:
if the selected word line is at the source-side of the unselected NAND string, the driven voltage on the bit line is allowed to reach the channel of the unselected NAND string for a duration during the applying of the increasing voltage which is inversely proportional to a distance of the selected word line from the source-end of the unselected NAND string.

8. The method of claim 1, wherein:
if the selected word line is at the drain-side of the unselected NAND string, the driven voltage on the source line is allowed to reach the channel of the unselected NAND string for a duration during the applying of the increasing voltage which is inversely proportional to a distance of the selected word line from the drain-end of the unselected NAND string.

9. The method of claim 1, wherein:
if the selected word line is at the source-side of the unselected NAND string, a magnitude of the driven voltage on the bit line when the driven voltage on the bit line is allowed to reach the channel of the unselected NAND string is proportional to a distance of the selected word line from the source-end of the unselected NAND string.

10. The method of claim 1, wherein:
if the selected word line is at the drain-side of the unselected NAND string, a magnitude of the driven voltage on the source line when the driven voltage on the source line is allowed to reach the channel of the unselected NAND string is proportional to a distance of the selected word line from the drain-end of the unselected NAND string.

11. The method of claim 1, wherein:
the multiple word lines comprise different adjacent subsets of word lines;
the selected word line is in one of the subsets of word lines; and
if the selected word line is at the source-side of the unselected NAND string, the driven voltage on the bit line is allowed to reach the channel of the unselected NAND string for a duration during the applying of the increasing voltage which is a function of a position of the one of the subsets among the different adjacent subsets.

12. The method of claim 1, wherein:
the multiple word lines comprise different adjacent subsets of word lines;
the selected word line is in one of the subsets of word lines; and
if the selected word line is at the source-side of the unselected NAND string, a magnitude of the driven voltage on the bit line when the driven voltage on the bit line is allowed to reach the channel of the unselected NAND string is set as a function of a position of the one of the subsets among the different adjacent subsets.

13. The method of claim 1, wherein:
the multiple word lines comprise different adjacent subsets of word lines;
the selected word line is in one of the subsets of word lines; and
if the selected word line is at the drain-side of the unselected NAND string, the driven voltage on the source line is allowed to reach the channel of the unselected NAND string for a duration during the applying of the increasing voltage which is a function of a position of the one of the subsets among the different adjacent subsets.

14. The method of claim 1, wherein:
the multiple word lines comprise different adjacent subsets of word lines;
the selected word line is in one of the subsets of word lines; and
if the selected word line is at the drain-side of the unselected NAND string, a magnitude of the driven voltage on the source line when the driven voltage on the source line is allowed to reach the channel of the unselected NAND string is set as a function of a position of the one of the subsets among the different adjacent subsets.

15. A memory controller, comprising:
a storage device comprising a set of instructions, the set of instructions comprising:
instructions to apply an increasing voltage to unselected memory cells in unselected word lines of a memory device in connection with a sensing operation involving a selected memory cell in a selected word line of the memory device, wherein the selected memory cell is in a selected NAND string of the memory device, unselected memory cells are in an unselected NAND string of the memory device, the unselected NAND string comprising a drain-end select gate at a drain-end of the unselected NAND string and a source-end select gate at a source-end of the unselected NAND string;
instructions to, —if the selected word line is at a source-side of the unselected NAND string, control the drain-end select gate of the unselected NAND string to, at different times during the applying of the increasing voltage, allow a driven voltage on a bit line to reach a channel of the unselected NAND string by providing the drain-end select gate in a conductive state and prevent the driven voltage on the bit line from reaching the channel of the unselected NAND string by providing the drain-end select gate in a non-conductive state;
instructions to, if the selected word line is at a drain-side of the unselected NAND string, control the source-end select gate of the unselected NAND string to, at different times during the applying of the increasing voltage, allow a driven voltage on a source line to reach the channel of the unselected NAND string by providing the source-end select gate in a conductive state and prevent the driven voltage on the source line from reaching the channel of the unselected NAND string by providing the source-end select gate in a non-conductive state;
instructions to, if the selected word line is midrange between the drain-end of the unselected NAND string and the source-end of the unselected NAND string, prevent the driven voltage on the bit line from reaching the channel of the unselected NAND string throughout the applying of the increasing voltage by providing the drain-end select gate of the unselected NAND string in a non-conductive state, and preventing the driven voltage on the source line from reaching the channel of the unselected NAND string throughout the applying of the increasing voltage by providing the source-end select gate of the unselected NAND string in a non-conductive state; and
instructions to sense a current in the selected NAND string via the bit line while a boosting voltage is set in the channel of the unselected NAND string; and a processor operable to execute the set of instructions.

16. The memory controller of claim 15, wherein the set of instructions further comprises:
instructions to allow the driven voltage on the bit line to reach the channel of the unselected NAND string for a duration during the applying of the increasing voltage which is inversely proportional to a distance of the selected word line from the source-end of the unselected NAND string, if the selected word line is at the source-side of the unselected NAND string.

17. The memory controller of claim 15, wherein the set of instructions further comprises:
instructions to allow the driven voltage on the source line to reach the channel of the unselected NAND string for a duration during the applying of the increasing voltage which is inversely proportional to a distance of the selected word line from the drain-end of the unselected NAND string, if the selected word line is at the drain-side of the unselected NAND string.

18. A 3D stacked non-volatile memory device, comprising:
multiple word lines of memory cells including a selected word line and unselected word lines;

an unselected NAND string comprising a drain-end select gate at a drain-end of the unselected NAND string and a source-end select gate at a source-end of the unselected NAND string;

a selected NAND string comprising a drain-end select gate at a drain-end of the selected NAND string and a source-end select gate at a source-end of the selected NAND string;

a selected memory cell connected to the selected word line, the selected memory cells is in the selected NAND string;

unselected memory cells connected to the unselected word line, the unselected memory cells are in the selected NAND string and in the unselected NAND string;

a bit line which is connected to the drain-end of the selected NAND string and the drain-end of the unselected NAND string; and a control circuit, the control circuit is configured to:
  apply an increasing voltage to the unselected memory cells via the unselected word lines in connection with a sensing operation involving the selected memory cell;
  during one portion of a time period in which the increasing voltage occurs, provide the drain-end select gate of the unselected NAND string and the source-end select gate of the unselected NAND string in a non-conductive state to float a voltage of a channel of the unselected NAND string;
  during another portion of the time period in which the increasing voltage occurs, if the selected word line is at a source-side of the unselected NAND string, provide the drain-end select gate end of the unselected NAND string in a conductive state to connect the channel of the unselected NAND string to a driven voltage on the bit line, wherein the driven voltage on the bit line is connected to the channel of the unselected NAND string for a duration during the time period in which the increasing voltage occurs, and the duration is inversely proportional to a distance of the selected word line from the source-end of the unselected NAND string; and
  after the time period, sense a current in the selected NAND string via the bit line.

19. The 3D stacked non-volatile memory device of claim 18, wherein the control circuit is configured to:
  during the another portion of the time period in which the increasing voltage occurs, if the selected word line is at a drain-side of the unselected NAND string, control the source-end select gate of the unselected NAND string to connect the channel of the unselected NAND string to a driven voltage on a source line.

20. The 3D stacked non-volatile memory device of claim 19, wherein the control circuit is configured to:
  if the selected word line is at the drain-side of the unselected NAND string, connect the driven voltage on the source line to the channel of the unselected NAND string for a duration during the time period in which the increasing voltage occurs, where the duration is inversely proportional to a distance of the selected word line from the drain-end of the unselected NAND string.

21. An apparatus, comprising:
multiple word lines of memory cells including a selected word line and unselected word lines;
an unselected string of the memory cells;
a selected string of the memory cells, the selected string and the unselected strings each comprise a charge-trapping layer and a polysilicon channel layer which extend vertically in a three-dimensional stacked memory structure;
means for performing a boosting phase of the sensing operation, the boosting phase sets a boosting voltage of a channel of an unselected string of the memory cells, the unselected string comprising a drain-end select gate at a drain-end of the unselected string and a source-end select gate at a source-end of the unselected string; and
means for, after the boosting voltage is set, performing a sensing phase of the sensing operation, the sensing phase senses a current in a selected string of the memory cells, the selected NAND string comprising a drain-end select gate at a drain-end of the selected NAND string and a source-end select gate at a source-end of the selected NAND string, wherein during the sensing phase, the current is sensed via a bit line which is connected to the drain-end of the selected string and the drain-end of the unselected string while one or more read voltages are applied to the selected word line;
wherein the means for performing a boosting phase comprises:
  means for applying an increasing voltage to the unselected word lines;
  means for, if the selected word line is at a source-side of the unselected string, controlling the drain-end select gate of the unselected string to, at different times during the applying of the increasing voltage, allow a driven voltage on the bit line to reach the channel of the unselected string by providing the drain-end select gate of the unselected string in a conductive state and prevent the driven voltage on the bit line from reaching the channel of the unselected string by providing the drain-end select gate of the unselected string in a non-conductive state;
  means for, if the selected word line is at a drain-side of the unselected string, controlling the source-end select gate of the unselected string to, at different times during the applying of the increasing voltage, allow a driven voltage on a source line to reach the channel of the unselected string by providing the source-end select gate of the unselected string in a conductive state and prevent the driven voltage on the source line from reaching the channel of the unselected string by providing the source-end select gate of the unselected string in a non-conductive state; and
  means for, if the selected word line is midrange between the drain-end of the unselected string and the source-end of the unselected string, preventing the driven voltage on the bit line from reaching the channel of the unselected string throughout the applying of the increasing voltage by providing the drain-end select gate of the unselected string in a non-conductive state throughout the applying of the increasing voltage, and preventing the driven voltage on the source line from reaching the channel of the unselected string, throughout the applying of the increasing voltage by providing the source-end select gate of the unselected string in a non-conductive state.

* * * * *